US006940161B2

(12) United States Patent
Kawanobe et al.

(10) Patent No.: US 6,940,161 B2
(45) Date of Patent: Sep. 6, 2005

(54) SEMICONDUCTOR DEVICE AND PROCESS FOR PRODUCING THE SAME

(75) Inventors: Tadashi Kawanobe, Tokyo (JP); Yasuharu Kameyama, Tokyo (JP); Masayuki Hosono, Tokyo (JP); Kazumoto Komiya, Tokyo (JP); Akiji Shibata, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/152,350

(22) Filed: May 22, 2002

(65) Prior Publication Data

US 2002/0185661 A1 Dec. 12, 2002

(30) Foreign Application Priority Data

May 22, 2001 (JP) ...................................... 2001-152751

(51) Int. Cl.[7] ................................................ H01L 23/48

(52) U.S. Cl. ....................... 257/702; 257/700; 257/787; 257/788

(58) Field of Search ................................ 257/700, 702, 257/787, 788, 99, 678, 778, 697; 438/117

(56) References Cited

U.S. PATENT DOCUMENTS 5,973,337 A * 10/1999 Knapp et al. ................. 257/99
6,028,364 A * 2/2000 Ogino et al. ................ 257/778
6,166,433 A * 12/2000 Takashima et al. ......... 257/702
6,202,298 B1 * 3/2001 Smith .......................... 29/840
6,281,570 B1 * 8/2001 Kameyama et al. ........ 257/697
6,538,209 B1 * 3/2003 Ouchi et al. ................ 174/256
6,642,083 B2 * 11/2003 Miyazaki et al. ........... 438/117

* cited by examiner

*Primary Examiner*—David Nelms
*Assistant Examiner*—Dao H. Nguyen
(74) *Attorney, Agent, or Firm*—Foley & Lardner LLP

(57) ABSTRACT

In a semiconductor device comprising: a wiring board comprising a conductor wiring having a predetermined pattern provided on the surface of an insulating substrate; an elastomer provided on the wiring board; a semiconductor chip bonded onto the wiring board through the elastomer; and an insulator for sealing the periphery of the semiconductor chip and the elastomer, the semiconductor chip in its external terminal being electrically connected to the conductor wiring, a part of the elastomer is exposed onto the surface of the insulator. By virtue of the above construction, a lowering in device reliability can be prevented.

3 Claims, 21 Drawing Sheets

SEMICONDUCTOR DEVICE AND PROCESS FOR PRODUCING THE SAME

BACKGROUND OF THE INVENTION

1. Field of the Invention

The invention relates to a semiconductor device and a process for producing the same and particularly to a technique that can be usefully applied to a semiconductor device in which a semiconductor chip is bonded onto a wiring board (an interposer) through an elastomer.

2. Prior Art

In conventional semiconductor devices (packages) such as BGA (ball grid array) and CSP (chip size package), a semiconductor chip is mounted on a wiring board called an "interposer." The interposer functions to register the external terminal of the semiconductor chip with the portion of connection of the conductor wiring on a mounting substrate for mounting thereon the semiconductor device, such as a printed wiring board, or to perform grid conversion of the external terminal of the semiconductor chip. In the interposer, a conductor wiring having a predetermined pattern and a terminal of connection to the mounting substrate are provided on the surface of an insulating substrate.

In the semiconductor device, for example, when a tape of a polyimide, which has a coefficient of thermal expansion of about 30 ppm/° C. to 40 ppm/° C., is used as the insulating substrate in the interposer, upon the operation of the semiconductor chip to raise the temperature of the semiconductor device to the operation temperature of the semiconductor device, a difference in expansion takes place between the insulating substrate and the semiconductor chip, because the coefficient of a thermal expansion of a conventional semiconductor chip using a silicon (Si) substrate is about 2.6 ppm/° C. This causes tensile stress to be applied to the face of connection between the insulating substrate (interposer) and the semiconductor chip. Due to the application of the tensile stress, a load is applied to a portion of connection between the external terminal of the semiconductor chip and the conductor wiring, resulting in breaking of a wire or the separation of the semiconductor chip. In another case, the insulating substrate is warped, leading to the application of a load to the portion of connection between the semiconductor device and the mounting substrate and resulting in breaking of a wire. To overcome this problem, a proposal has been made on a semiconductor device wherein, for example, a semiconductor chip is mounted on the interposer through a flexible material, called an elastomer, as means for relaxing the thermal stress caused by the difference in coefficient of thermal expansion between the insulating substrate and the semiconductor chip.

An example of the semiconductor device, in which a semiconductor chip has been mounted through the elastomer, is shown in FIGS. 1 and 2. In this semiconductor device, a semiconductor chip 4 is flip chip mounted through an elastomer 3 on an interposer comprising the above type of conductor wiring 2 provided on the surface of the above type of insulating substrate 1, and the conductor wiring 2 in its portion protruded in an opening 1A of the insulating substrate 1 and an opening 3A of the elastomer 3 is deformed to connect the conductor wiring 2 in its protruded portion to an external terminal 401 in the semiconductor chip 4. Here FIG. 1 is a typical plan view of the BGA-type semiconductor device, and FIG. 2 a typical cross-sectional view taken on line G–G' of FIG. 1.

In the BGA-type semiconductor device shown in FIGS. 1 and 2, the elastomer 3 and the conductor wiring 2 in its deformed portion absorb the thermal stress caused by the difference in coefficient of thermal expansion between the semiconductor chip 4 and the insulating substrate 1 (interposer) and thus can relax the thermal stress. Further, as shown in FIG. 2, a via hole 1B is provided in the insulating substrate 1, and a ball terminal 6 for connection to the conductor wiring 2 is provided in the via hole 1B portion. The ball terminal 6 is used, for example, in mounting the semiconductor device on a mounting substrate such as a mother board, as a terminal of connection between the wiring conductor 2 and wiring (terminal) on the mounting substrate.

A production process of the BGA-type semiconductor device shown in FIGS. 1 and 2 will be briefly explained. At the outset, as shown in FIG. 3A, for example, an interposer (a wiring board) comprising a conductor wiring 2 having a predetermined pattern provided on the surface of the insulating substrate 1 provided with an opening 1A for bonding and a via hole 1B at respective predetermined positions is provided. In this case, as shown in FIGS. 1 and 3A, the conductor wiring 2 is formed so that a part of the conductor wiring 2 is projected into the opening 1A for bonding while another part of the conductor wiring 2 covers the via hole 1B.

The interposer is produced, for example, by forming the opening 1A for bonding and the via hole 1B using a mold in the insulating substrate 1 such as a polyimide tape, then forming a thin conductor layer formed of a copper foil or the like on the surface of the insulating substrate 1, and patterning the thin conductor layer by etching or the like to form the conductor wiring 2. Another example of the method for producing the interposer comprises the steps of forming the thin conductor layer on the surface of the insulating substrate 1, then forming the opening 1A for bonding and the via hole 1B in the insulating substrate 1 by laser etching using a carbonic gas laser, an excimer laser or the like, and patterning the thin conductor layer by etching or the like to form the conductor wiring 2.

In this case, the insulating substrate 1 is generally in a tape form which is continuous in one direction, and, in many cases, a large number of semiconductor devices are continuously produced in a single insulating substrate 1 of the above type by a reel to reel method, followed by taking-off of predetermined regions (package regions) from the insulating substrate 1 to prepare individual pieces. The region as shown in FIG. 3A is repeatedly formed over the whole insulating substrate 1.

Next, in the step of elastomer bonding, as shown in FIG. 3B, an elastomer 3 having an opening provided at a position corresponding to the opening 1A for bonding in the insulating substrate 1 is bonded to the surface of the interposer, in other words, the interposer in its surface on which the conductor wiring 2 has been formed. For example, a three-layer structure comprising an elastic material having a coefficient of thermal expansion of not more than 100 ppm/° C. or a modulus of elasticity of not more than 1000 MPa and an adhesive layer provided on both sides of the elastic material may be used as the elastomer. The elastic material is preferably a porous material highly permeable to water. The adhesive layer is formed of, for example, a heat-curable resin which has been cured to a stage B.

Next, in the step of bonding a semiconductor chip, as shown in FIG. 3C, the semiconductor chip 4 is bonded onto the elastomer 3. At that time, the semiconductor chip 4 is registered so that the external terminal 401 is located within the opening 3A in the elastomer 3 and the external terminal 401 overlaps with the conductor wiring 2 in a planner manner, followed by bonding onto the elastomer 3. Thereafter, heating is carried out to fully cure the adhesive layer in the elastomer 3.

Next, the conductor wiring 2 in its portion projected into the opening 1A for bonding in the insulating substrate 1 is press cut with a bonding tool in the step of wire connection, and, as shown in FIG. 3D, the cut portion of the conductor wiring 2 is pushed into the opening 3A in the elastomer 3 and is deformed. Thereafter, for example, ultrasonic vibration is applied from the bonding tool to the conductor wiring 2 to connect the conductor wiring 2 to the semiconductor chip in its external terminal 401. In this case, the conductor wiring 2 in its portion projected into the opening 1A for bonding is partly narrowed in its predetermined position so that, upon press cutting with the bonding tool, the projection portion can be connected to a predetermined external terminal, although this is not shown in the drawing.

Next, in the step of sealing, an insulator 5 formed of, for example, a heat-curable epoxy resin is poured through the opening 1A for bonding in the insulating substrate 1 and is cured to seal the portion of connection between the conductor wiring 2 and the semiconductor chip in its external terminal 401.

Thereafter, in the step of connection of a ball terminal, a ball terminal 6 formed of, for example, a Pb·Sn-base solder is connected to the via hole 1B in the insulating substrate 1, followed by cutting of the insulating substrate 1 (interposer) to take off predetermined regions (package regions) to prepare individual pieces. Thus, the BGA-type semiconductor device as shown in FIGS. 1 and 2 can be prepared.

Further, in the semiconductor device shown in FIGS. 1 and 2, for example, a center pad-type semiconductor chip, wherein the external terminal 401 is provided around the center line of the surface of a silicon substrate provided with a circuit such as DRAM (a dynamic random access memory), is used as the semiconductor chip 4. Another example of the semiconductor device is a semiconductor device using a peripheral pad-type semiconductor chip wherein the external terminal 401 is provided around the end in the long side direction or the short side direction of the surface of the silicon substrate provided with a circuit. The connection terminal mounted on the mounting substrate is not limited to the ball terminal 6, and, for example, a connection terminal may be used wherein a flat connection terminal (a land) is formed using a copper double clad laminate board on the face of connection to the mounting substrate.

In the case of the semiconductor device as shown in FIGS. 1 and 2, the portion of connection between the conductor wiring 2 and the semiconductor chip in its external terminal 401 is merely sealed with the insulator 5. Therefore, the semiconductor chip 4 is externally exposed. For example, in the case of MCM (multi-chip module), the semiconductor device is used as a component of an electronic device which, in the state of being mounted on a mounting substrate such as a mother board, has one function. In this case, when the semiconductor chip 4 is externally exposed, for example, at the time of mounting of the semiconductor device on the mounting substrate or at the time of use of the semiconductor substrate mounted on the mounting substrate, a problem occurs such that the exposed surface of the semiconductor chip 4 is damaged, or the corner portion of the semiconductor chip 4 is broken.

Further, since the semiconductor chip 4 and the elastomer 3 are in the exposed state, water is likely to penetrate through the adhesive interface of the semiconductor chip 4 and the elastomer 3. When a porous material is used as the elastic material used in the elastomer 3, the elastomer 3 is likely to absorb water. This poses a problem that the absorbed or penetrated water causes the separation of the semiconductor chip 4, or the conductor wiring 2, the internal wiring in the semiconductor chip 4 or the like is likely to be attacked resulting in deteriorated electrical characteristics.

To overcome this problem, a semiconductor device, wherein not only the connection between the conductor wiring 2 and the semiconductor chip in its external terminal 401 but also, as shown in FIG. 4, the periphery of the semiconductor chip 4 and the elastomer 3 has been sealed with the insulator 5, has been proposed and used.

The semiconductor device shown in FIG. 4 is produced as follows. In the procedure as shown in FIGS. 3A, 3B, 3C, and 3D, the semiconductor chip 4 is bonded onto the interposer through the elastomer 3, and the conductor wiring 2 is connected to the semiconductor chip in its external terminal 401. Thereafter, in the step of sealing, the periphery of the semiconductor chip 4 and the elastomer 3 and the connection between the conductor wiring 2 and the semiconductor chip in its external terminal 401 are sealed with the insulator 5, for example, by transfer molding using a mold. The ball terminal 6 is then connected, and the interposer in its predetermined regions is taken off to prepare individual pieces.

In the step of sealing, when the periphery of the semiconductor chip 4 and the elastomer 3 is sealed by transfer molding, for example, as shown in FIG. 5A, the interposer, on which the semiconductor chip 4 has been flip chip mounted, is sandwiched and fixed between an upper die 7, provided with a cavity 702 for receiving the semiconductor chip 4 and the elastomer 3, and a lower die 8 in a flat plate form. In this case, for example, between the upper die 7 and the lower die 8, as shown in FIG. 5A, in addition to the cavity 702, provided are spaces, for example, a pot 704, into which the insulator 5 for sealing the semiconductor chip 4 is introduced, a gate 701 for pouring the insulator 5, which has been introduced into the pot 704 and melted, into the cavity 702, and an air vent 703 which, when the insulator 5 has been poured through the gate 701, functions to release air within the cavity 702 to the outside of the assembly.

In the case of the transfer molding, after the heat-curable resin as the insulator 5 is introduced into the pot 704 and melted, as shown in FIG. 5B, the melted insulator 5 is pressed by means of a plunger 10. This permits the insulator 5 to be passed through the gate 701 and to be poured into the cavity 702. After the insulator 5 is poured into the cavity 702 to fill the periphery of the semiconductor chip 4 and the elastomer 3 with the insulator 5, the insulator 5 is cured, followed by the removal of the upper die 7 and the lower die 8. Thus, the periphery of the semiconductor chip 4 and the elastomer 3 and the connection between the conductor wiring 2 and the semiconductor chip in its external terminal 401 are sealed with the insulator 5.

Methods for sealing the periphery of the semiconductor chip 4 and the elastomer 3 with the insulator 5 include, in addition to the above transfer molding using a mold, a method wherein the whole surface of the interposer, on which the semiconductor chip 4 has been flip chip mounted, is coated with an insulator 5 formed of a heat-curable resin or the like.

In the above prior art method, however, in the step of sealing, when the periphery of the semiconductor chip 4 is sealed with the insulator 5 by the transfer molding using a mold, the periphery of the elastomer 3 is also sealed with the insulator 5.

In general, a porous material, which is highly flexible and highly permeable to water, is in many cases used as the elastomer 3 and, thus, water is likely to be incorporated into the pore portion present in the material. The water incorporated into the elastomer 3 is vaporized and expanded, for example, in the step of heating for mounting the semiconductor device on the mounting substrate. At that time, when the periphery of the elastomer 3 is sealed with the insulator as in the case of the semiconductor device shown in FIG. 4, however, the vaporized water cannot be released to the outside of the semiconductor device. This poses a problem that thermal shock caused by the vaporization and expansion of the water within the elastomer 3 is likely to cause the separation of the semiconductor chip 4 or the interposer.

Further, when the water incorporated into the elastomer 3 cannot be released to the outside of the semiconductor device, metal portions such as the conductor wiring 2, the internal wiring in the semiconductor chip 4 and the like are likely to be attacked by the incorporated water and, thus, disadvantageously, the electrical characteristics of the semiconductor device are likely to be deteriorated.

SUMMARY OF THE INVENTION

Accordingly, it is an object of the invention to provide a technique which can prevent a lowering in device reliability in a semiconductor device comprising a semiconductor chip mounted on a wiring board (an interposer) through an elastomer, the periphery of the semiconductor chip having been sealed with an insulator.

It is another object of the invention to provide a technique which can reduce a device failure caused by the separation of a semiconductor chip or a wiring board in a semiconductor device comprising a semiconductor chip mounted on a wiring board (an interposer) through an elastomer, the periphery of the semiconductor chip having been sealed with an insulator.

It is a further object of the invention to provide a technique which can reduce a deterioration in electrical characteristics in a semiconductor device comprising a semiconductor chip mounted on a wiring board (an interposer) through an elastomer, the periphery of the semiconductor chip having been sealed with an insulator.

The forgoing and other objects and novel features of the invention will be apparent to those skilled in the art from the following detailed description and appended claims taken in connection with the accompanying drawings.

The invention disclosed herein will be summarized below.

(1) A semiconductor device comprising: a wiring board comprising a conductor wiring having a predetermined pattern provided on the surface of an insulating substrate; an elastomer provided on the wiring board; a semiconductor chip bonded onto the wiring board through the elastomer; and an insulator for sealing the periphery of the semiconductor chip and the elastomer, the semiconductor chip in its external terminal being electrically connected to the conductor wiring, wherein a part of the elastomer is exposed onto the surface of the insulator.

According to the semiconductor device in the above item (1), since a part of the elastomer is exposed onto the surface of the insulator, in the step of heating, for example, at the time of mounting of the semiconductor device onto the mounting substrate, water incorporated into the elastomer can be released through the exposed portion to the outside of the semiconductor device. By virtue of this, the separation of the semiconductor chip or the wiring board caused by thermal shock attributable to vaporization or expansion of water incorporated into the elastomer can be prevented.

Further, since, in the step of heating, water incorporated into the elastomer can be released to the outside of the semiconductor device, it is possible to prevent an unfavorable phenomenon such that water, which stays within the elastomer, reaches metal portions in the semiconductor device, such as the conductor wiring or the internal wiring in the semiconductor chip, and attacks the metal portions. Therefore, a deterioration in electrical characteristics can be prevented.

For example, a porous material, which is highly permeable to water, is in many cases used as the elastomer. In this case, the exposure of only a part of the elastomer can reduce the amount of water absorbed in the elastomer. Therefore, the separation of the semiconductor chip by the absorption of moisture in the elastomer and a deterioration in electrical characteristics can also be reduced.

(2) A process for producing a semiconductor device, comprising the steps of: providing a wiring board comprising an insulating substrate, a conductor wiring having a predetermined pattern provided on the surface of the insulating substrate, and an elastomer provided on the insulating substrate in its predetermined position, and bonding a semiconductor chip onto the wiring board through the elastomer (step of bonding a semiconductor chip); electrically connecting the semiconductor chip in its external terminal to the conductor wiring (step of connecting wiring); sealing the periphery of the semiconductor chip bonded onto the wiring board and the periphery of the elastomer with an insulator (step of sealing); and, after the step of sealing, taking off the wiring board in its predetermined regions to prepare individual pieces (step of separation into individual pieces), wherein in the step of separation into individual pieces, in taking off the wiring board in its predetermined position, a part of the peripheral portion of the elastomer is cut.

According to the production process in the item (2), in the step of separation into individual pieces, cutting a part of the peripheral portion of the elastomer permits a part of the elastomer sealed with the insulator to be exposed onto the surface of the insulator. By virtue of this, a semiconductor device can be produced which can release water incorporated into the elastomer to the outside of the semiconductor device through the exposed portion and thus can prevent a lowering in reliability attributable to water incorporated into the elastomer.

Further, since the periphery of the semiconductor chip is sealed with the insulator, at the time of handling, damage to the semiconductor chip and breaking of the corner portion of the semiconductor chip can be prevented.

(3) A process for producing a semiconductor device, comprising the steps of: providing a wiring board comprising an insulating substrate and a conductor wiring having a predetermined pattern provided on the surface of the insulating substrate and bonding an elastomer onto the wiring board in its predetermined position (step of bonding an elastomer); bonding a semiconductor chip onto the elastomer bonded onto the wiring board (step of bonding a semiconductor chip); electrically connecting the semiconductor chip in its external terminal to the conductor wiring (step of connecting wiring); sealing the periphery of the semiconductor chip bonded onto the wiring board and the periphery of the elastomer with an insulator (step of sealing); and, after the step of sealing, taking off the wiring board in its predetermined regions to prepare individual pieces (step of separation into individual pieces) wherein the step of bonding an elastomer is carried out so that a part of the peripheral portion of the elastomer is projected into a portion outside the region which is to be taken off in the step of separation into individual pieces.

According to the production process in the item (3), the elastomer having a projection extended to a portion outside the region to be taken off in the separation of the wiring board into individual pieces is bonded onto the wiring board. By virtue of the above construction, even when the periphery of the semiconductor chip and the elastomer is sealed with the insulator in the step of sealing, at the time of separation into individual pieces, the projection of the elastomer can be cut and partially exposed. By virtue of this, a semiconductor device can be produced which can release water incorporated into the elastomer to the outside of the semiconductor device through the exposed portion and thus can prevent a lowering in reliability attributable to water incorporated into the elastomer.

Further, since the periphery of the semiconductor chip is sealed with the insulator, at the time of handling, damage to the semiconductor chip and breaking of the corner portion of the semiconductor chip can be prevented.

In the production processes in the items (2) and (3), the step of sealing may be carried out, for example, by a method comprising the steps of: placing and fixing the wiring board between an upper die having a space (a cavity), which is large enough to receive the elastomer and the semiconductor chip bonded onto the wiring board, and an opening (a gate), into which a resin is poured, and a lower die; pouring a liquid resin through the opening into the cavity; curing the resin; and then removing the assembly from the upper and lower dies.

Sealing of the semiconductor chip and the elastomer by transfer molding using the upper die and the lower die permits the periphery of the semiconductor chip and the insulator to be sealed with an insulator having proper thickness and shape. Therefore, a waste of the insulator can be reduced, and the material cost can be reduced.

When the upper and lower dies are used, it is easy to render the surface of the insulator flat and to render the outward form of each semiconductor device uniform. Therefore, a semiconductor device can be produced which is easy to handle, for example, at the time of mounting.

Other methods for carrying out the step of sealing include, in addition to the transfer molding using the upper and lower dies, a method wherein a liquid resin is coated on the whole surface of the wiring board followed by curing of the coating and a method wherein a liquid resin is potted only on and around the semiconductor chip. In these methods, however, the portion to be cut in the step of separation into individual pieces becomes thick due to the provision of the insulator. This causes the application of a large load at the time of cutting, and the cut face is likely to be rough. Further, it is difficult to render the outward form of the insulator flat and uniform. For this reason, sealing by transfer molding using the upper and lower dies is preferred.

The provision of a predetermined space between the upper die and the elastomer in its projection portion to avoid direct contact of the elastomer with the upper die can prevent the transfer or adhesion of the adhesive layer located on the surface of the elastomer onto the upper die or the contamination of the upper die upon heating of the upper die. This can contribute to improved yield of the semiconductor device.

Further, in this case, since the projection of the elastomer is a portion to be cut in the later step of separation into individual pieces, in order to reduce the load applied at the time of cutting, preferably, the thickness of the insulator in its portion on the projection of the elastomer is as small as possible and the distance from the upper die to the elastomer in its projection portion is not more than 100 $\mu$m. When the accuracy of the thickness and the flatness of the elastomer are taken into consideration, the distance from the upper die to the elastomer in its projection portion is considered necessary to be not less than 5 $\mu$m.

In the production processes in the items (2) and (3), preferably, the wiring board has a first opening and a second opening in respective predetermined positions of the insulating substrate;

the conductor wiring is provided on the surface of the insulating substrate so that the conductor wiring covers the first opening and is projected into the second opening;

in the step of bonding an elastomer, the elastomer has the projection and has an opening in its portion corresponding to the second opening of the insulating substrate;

in the step of bonding a semiconductor chip, the conductor wiring in its portion projected into the second opening of the insulating substrate is allowed to face and is bonded to the semiconductor chip in its external terminal; and in the step of connecting wiring, the conductor wiring in its portion projected into the second opening of the insulating substrate is deformed and is connected to the semiconductor chip in its external terminal.

When the conductor wiring is deformed and connected, the thermal stress attributable to the difference in coefficient of thermal expansion between the semiconductor chip and the wiring board (insulating substrate) can be relaxed by the elastomer and the conductor wiring. By virtue of this, the separation of the conductor wiring from the semiconductor chip in its external terminal at the connection between the conductor wiring and the external terminal of the semiconductor chip can be prevented. This can realize the provision of a semiconductor device having high connection reliability.

BRIEF DESCRIPTION OF THE DRAWINGS

The invention will be explained in more detail in conjunction with the appended drawings, wherein:

FIGS. 7A and 7B are typical schematic views showing the construction of the semiconductor device in the preferred embodiment of the invention, wherein FIG. 7A is a cross-sectional view taken on line A–A' of FIG. 6 and FIG. 7B a right side view of the semiconductor device shown in FIG. 6;

FIGS. 12A and 12B are typical views illustrating a production process of the semiconductor device in the preferred embodiment of the invention, wherein FIG. 12A is a cross-sectional view taken on line B–B' of FIG. 11 and FIG. 12B a cross-sectional view taken on line C–C' of FIG. 11;

FIGS. 15A and 15B are typical views illustrating a production process of the semiconductor device in the preferred embodiment of the invention, wherein FIG. 15A is a cross-sectional view of an assembly after bonding of a ball terminal and FIG. 15B a cross-sectional view taken on line D–D' of FIG. 11 in the step of separation into individual pieces;

FIGS. 16A and 16B are typical views illustrating a production process of the semiconductor device in the preferred embodiment of the invention, wherein FIG. 16A is a cross-sectional view taken on line B–B' of FIG. 11 in the step of separation into individual pieces and FIG. 16B a cross-sectional view taken on line C–C' of FIG. 11 in the step of separation into individual pieces;

FIGS. 17A and 17B are typical views illustrating the function and effect of the semiconductor device in the preferred embodiment of the invention, wherein FIG. 17A is a front view of the mounted semiconductor device in the preferred embodiment of the invention and FIG. 17B a cross-sectional view taken on line E–E' of FIG. 17A;

FIGS. 21A and 21B are typical views showing the third variant of the semiconductor device in the preferred embodiment of the invention, wherein FIG. 21A is a cross-sectional view taken on line F–F' of FIG. 20 and FIG. 21B a right side view of FIG. 20.

DESCRIPTION OF THE PREFERRED EMBODIMENTS

Figure 1:
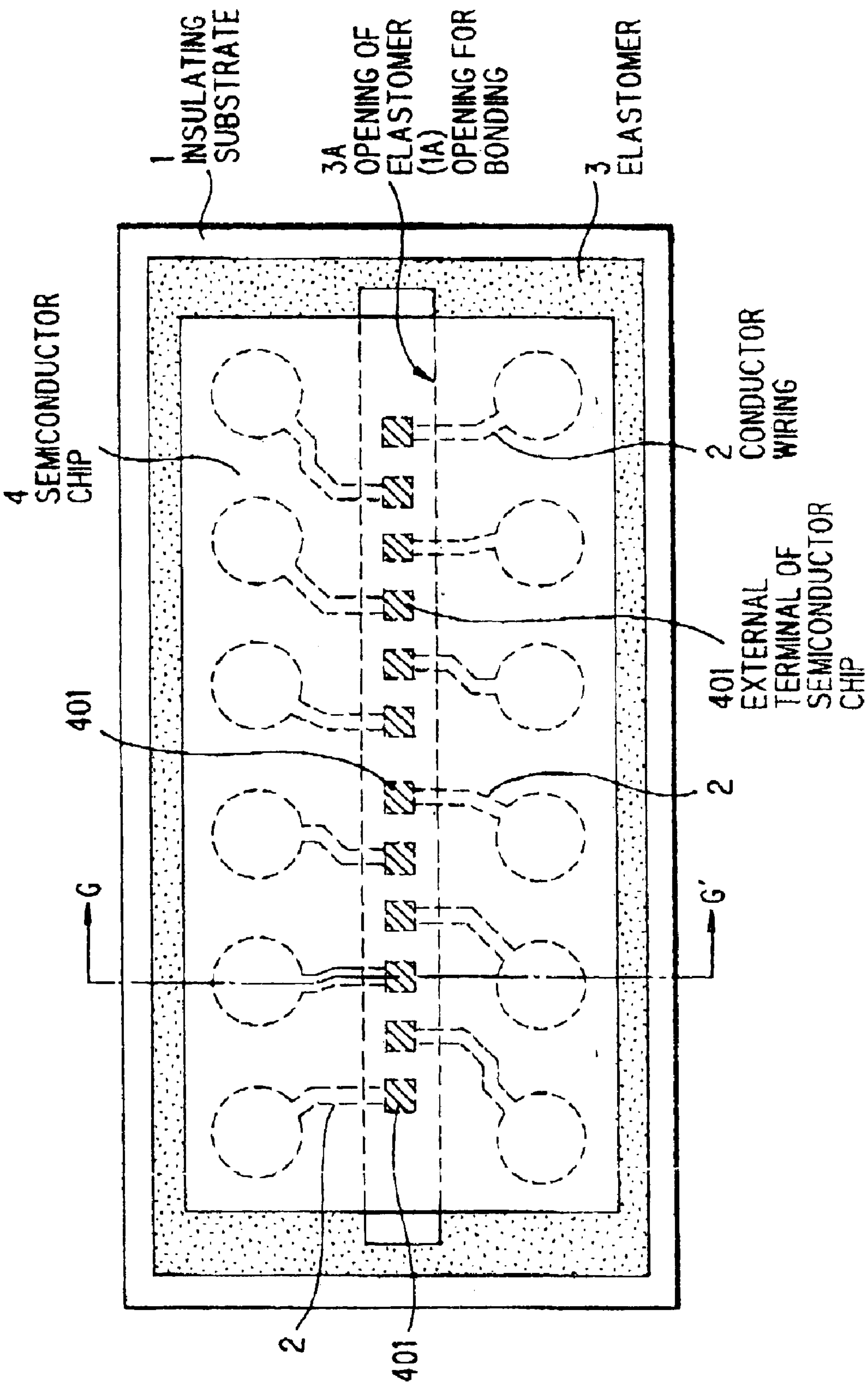
FIG. 1 is a typical schematic plan view showing the construction of a conventional semiconductor device.
Figure 2:
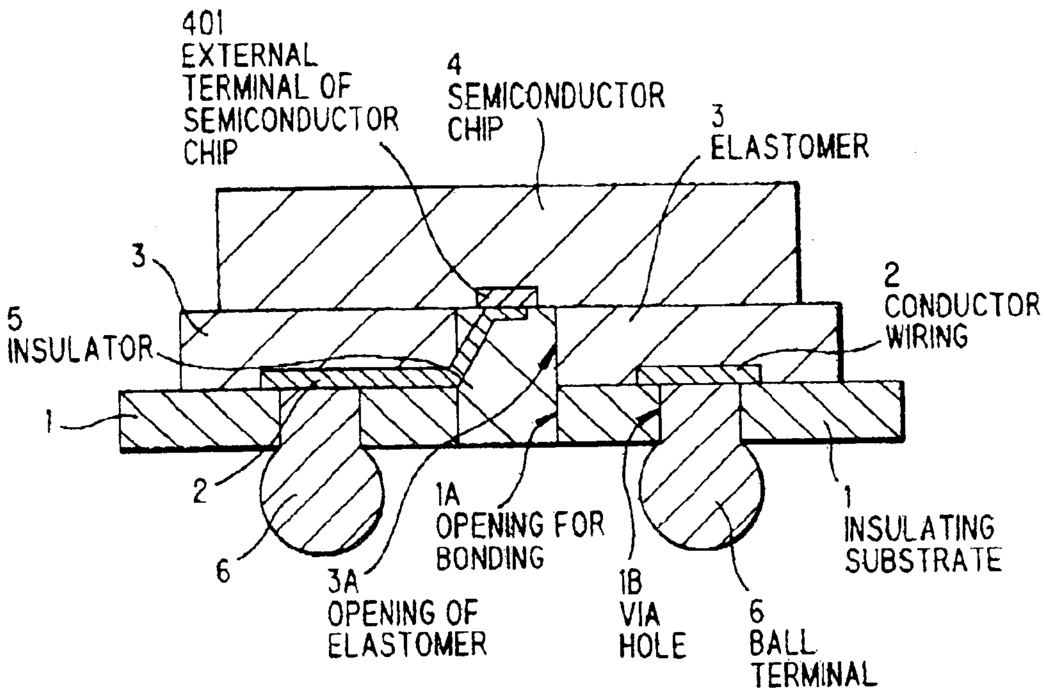
FIG. 2 is a cross-sectional view taken on line G–G' of FIG. 1.
Figure 3A:
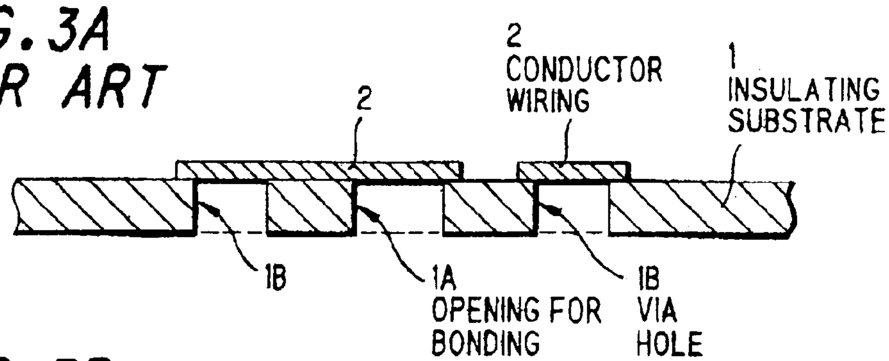
FIGS. 3A to 3D are typical cross-sectional views showing respective steps constituting a production process of a conventional semiconductor device.
Figure 3B:
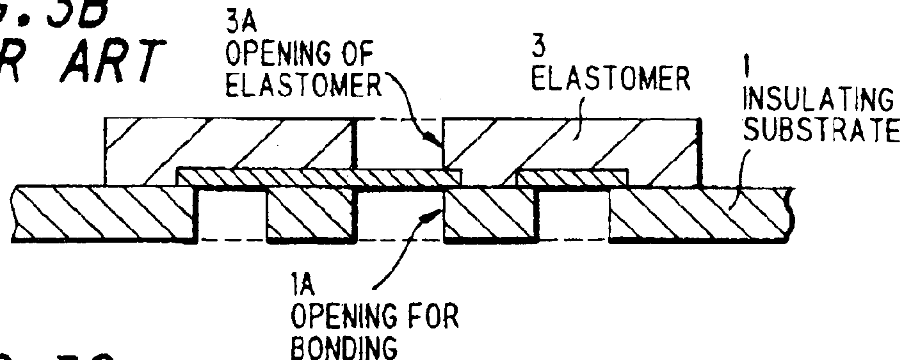
Figure 3C:
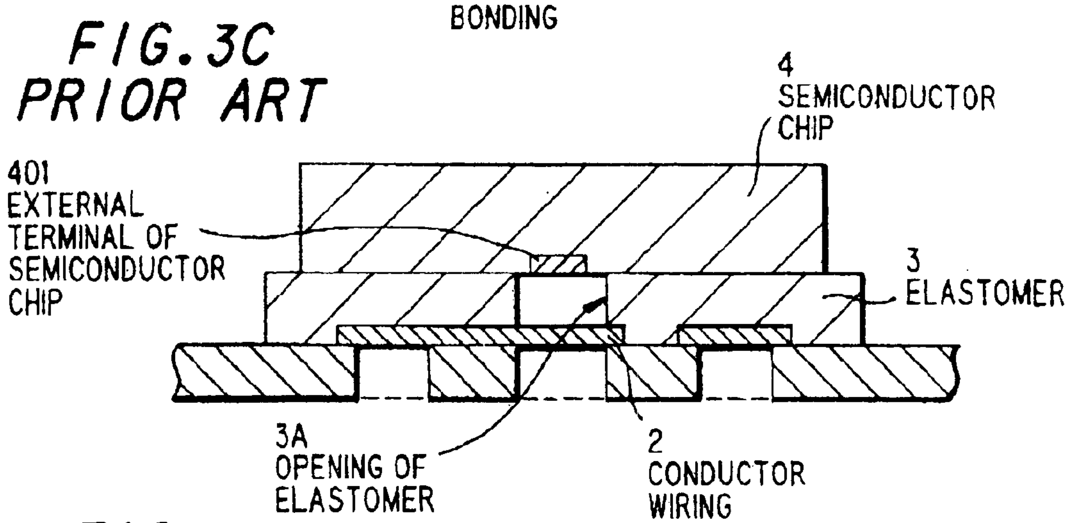
Figure 3D:
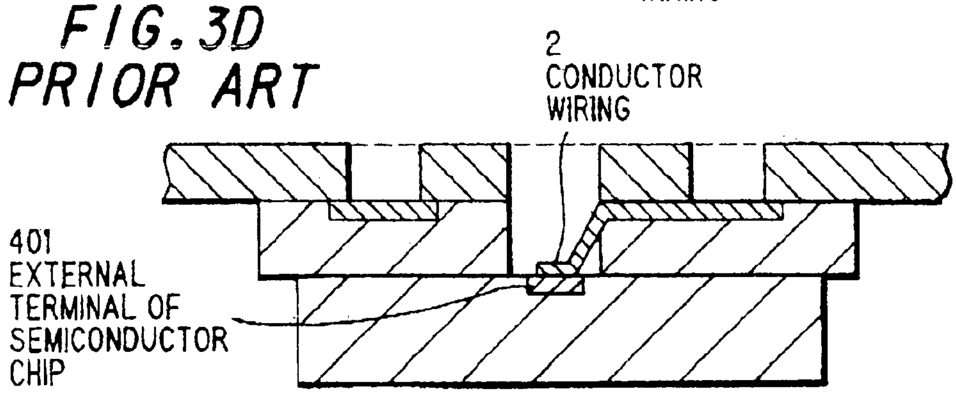
Figure 4:
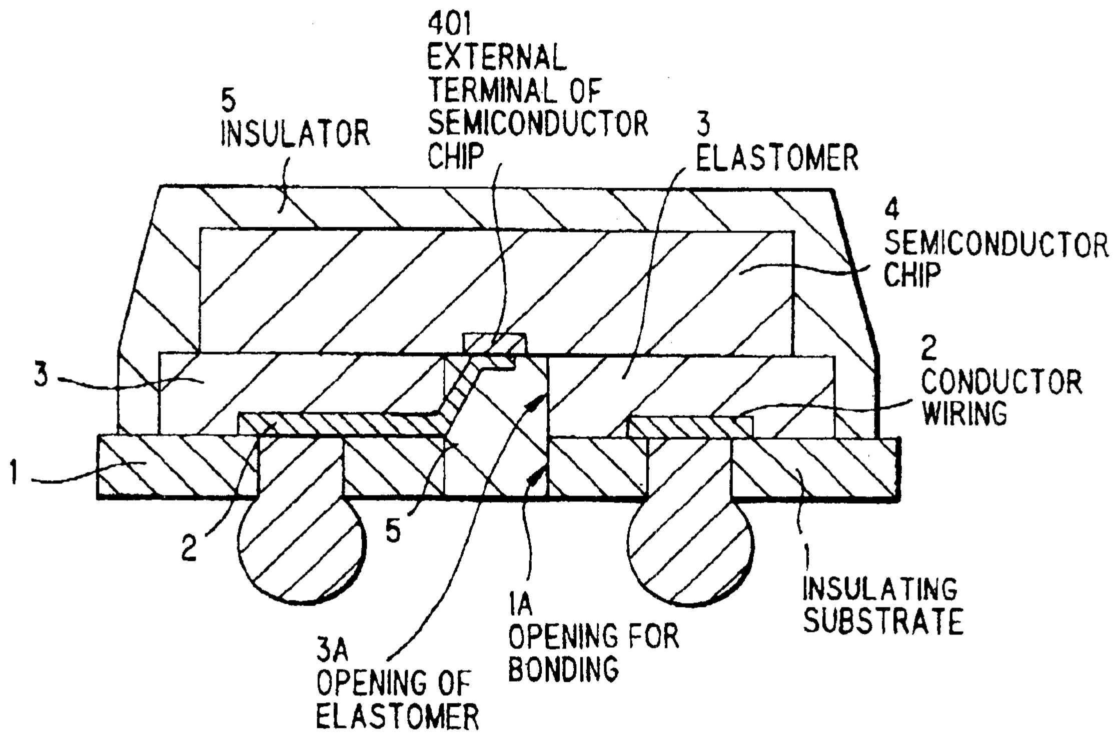
FIG. 4 is a typical schematic cross-sectional view showing the construction of a conventional semiconductor device.

Preferred embodiments of the invention will be explained in conjunction with the accompanying drawings.

Throughout all of the drawings used for explaining the preferred embodiments, like parts are identified with the same reference numerals, and the overlapped explanation of the like parts will be omitted.

Figure 6:
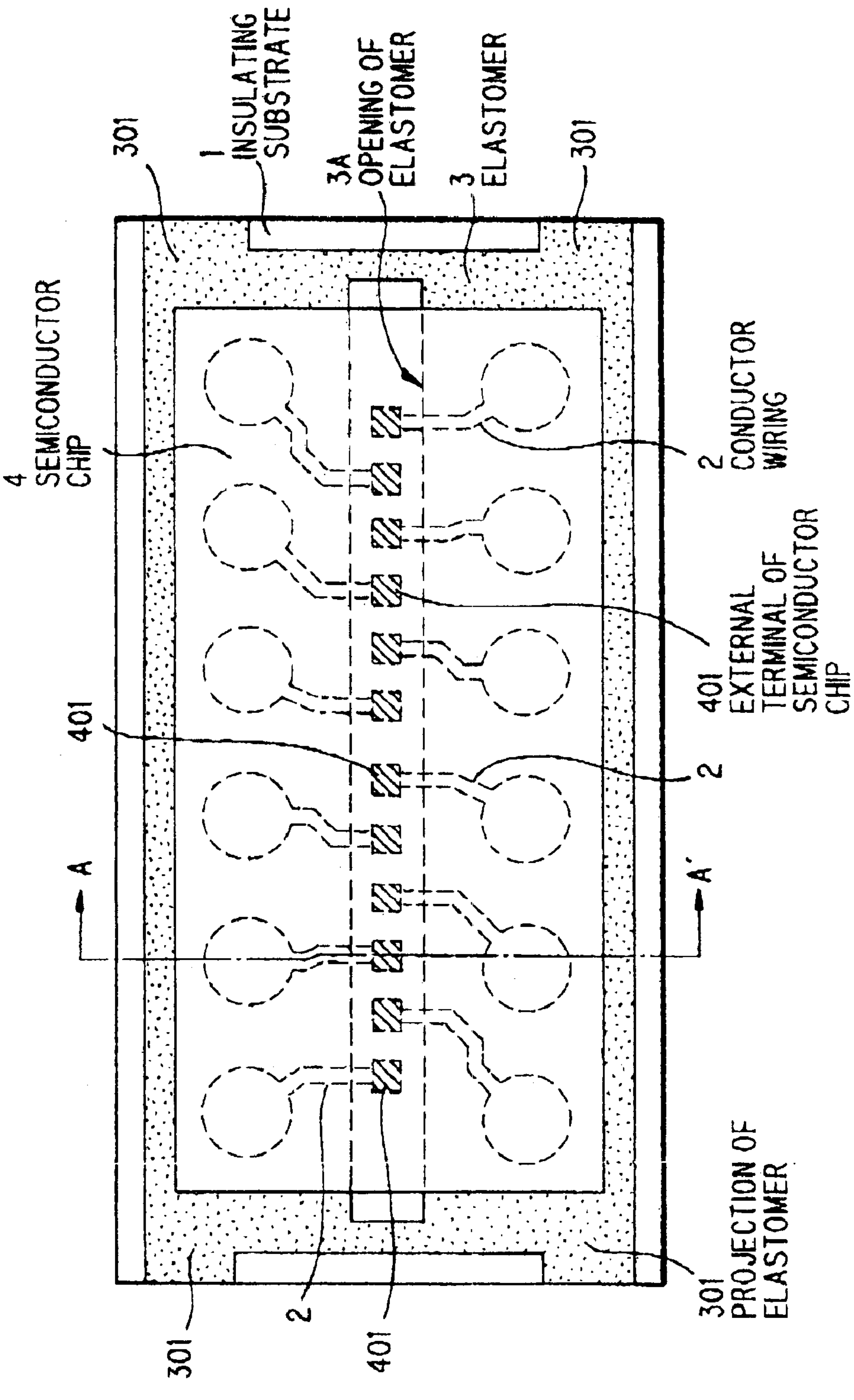
FIG. 6 is a typical schematic plan view showing the construction of a semiconductor device in one preferred embodiment of the invention.
Figure 7A:
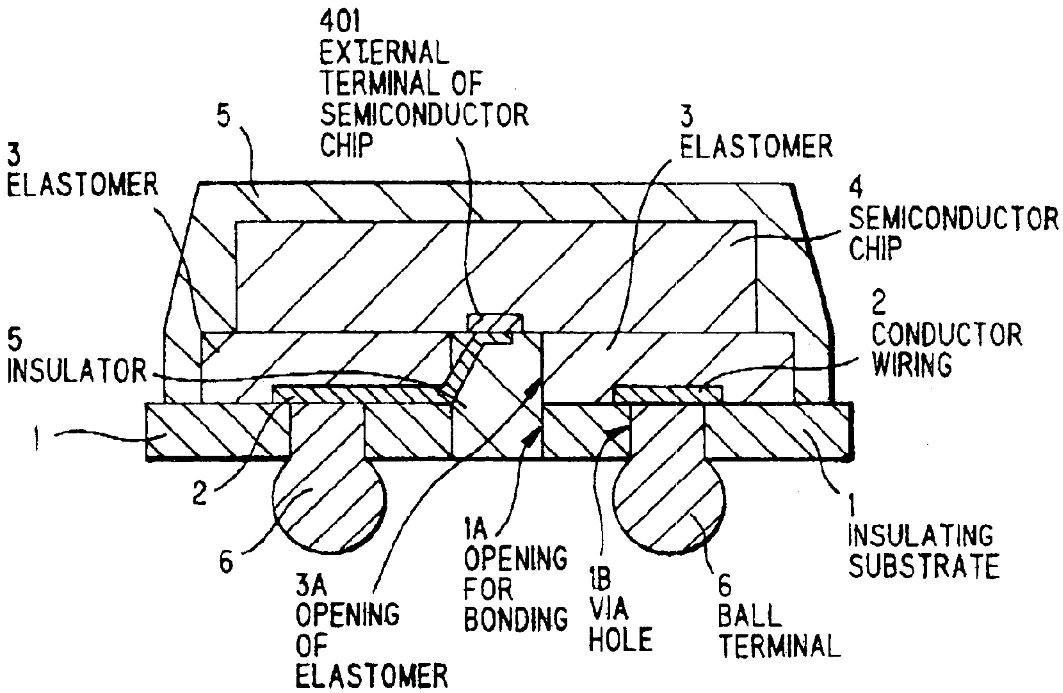
Figure 7B:
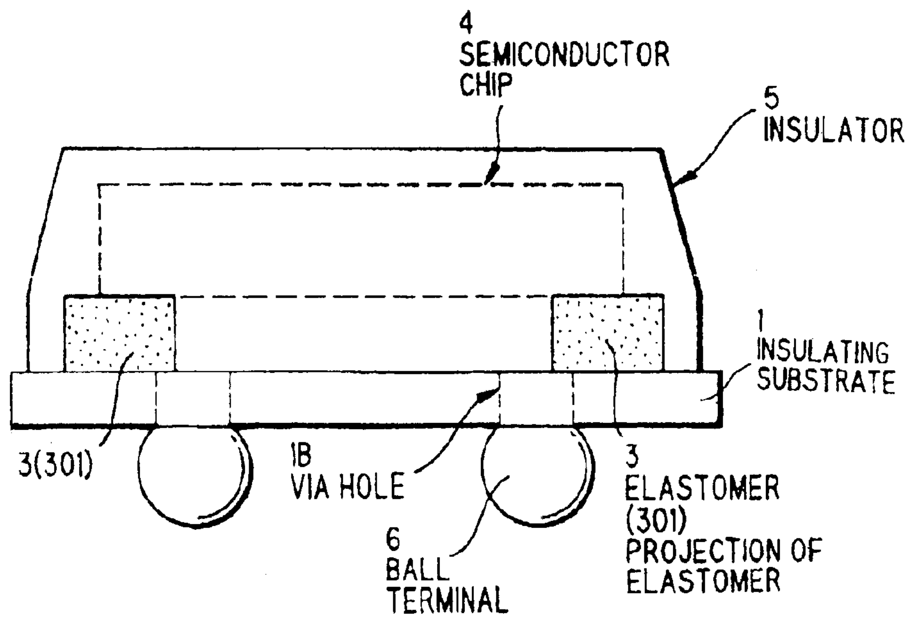

FIG. 6 and FIGS. 7A and 7B are typical schematic views showing the construction of a semiconductor device in one preferred embodiment of the invention. Specifically, FIG. 6 is a plan view of a semiconductor device in the preferred embodiment of the invention, FIG. 7A a cross-sectional view taken on line A–A' of FIG. 6, and FIG. 7B a right side view of FIG. 6. In FIG. 6, an insulator for sealing a semiconductor chip and an elastomer is not shown.

In FIG. 6, numeral 1 designates an insulating substrate, numeral 2 a conductor wiring, numeral 3 an elastomer, numeral 301 a projection (a moisture vent portion) of the elastomer, numeral 3A an opening of elastomer, numeral 4 a semiconductor chip, and numeral 401 an external terminal of the semiconductor chip. In FIGS. 7A and 7B, numeral 1A designates an opening for bonding, numeral 1B a via hole, numeral 5 an insulator (a sealing material), and numeral 6 a ball terminal.

As shown in FIGS. 6 and 7A, the semiconductor device in this preferred embodiment comprises: a wiring board comprising a conductor wiring 2 having a predetermined pattern provided on the surface of an insulating substrate 1; an elastomer 3 provided on the wiring board; a semiconductor chip 4 bonded onto the wiring board through the elastomer 3; and an insulator 5 for sealing the periphery of the semiconductor chip 4 and the elastomer 3. Openings 1A, 3A for bonding are provided in the insulating substrate 1 and the elastomer 3 at their position corresponding to an external terminal 401 of the semiconductor chip 4. The conductor wiring 2 in its portion projected into the openings 1A, 3A for bonding is deformed to connect the conductor wiring 2 to the semiconductor chip in its external terminal 401. The inside of the openings 1A, 3A for bonding is filled with the insulator 5 for sealing the connection between the conductor wiring 2 and the semiconductor chip in its external terminal 401.

The semiconductor device in this preferred embodiment is a BGA-type semiconductor device wherein, as shown in FIG. 7A, a via hole 1B is provided in the insulating substrate 1 and a ball terminal 6 for connection to the conductor wiring 2 is provided in the via hole 1B.

Further, in the semiconductor device in the preferred embodiment, as shown in FIGS. 6 and 7B, a projection 301 extending to the peripheral portion of the insulating substrate 1 is provided in the elastomer 3, and the projection (hereinafter referred to as "moisture vent portion") 301 of the elastomer is exposed on the surface of the insulator 5. The elastomer 3 may have, for example, a three-layer structure wherein an adhesive layer is provided on both sides of an elastic material having a coefficient of thermal expansion of not more than 100 ppm/° C., although the three-layer structure is not shown in the drawing. The elastic material is a porous material which is highly permeable to water.

Figure 8:
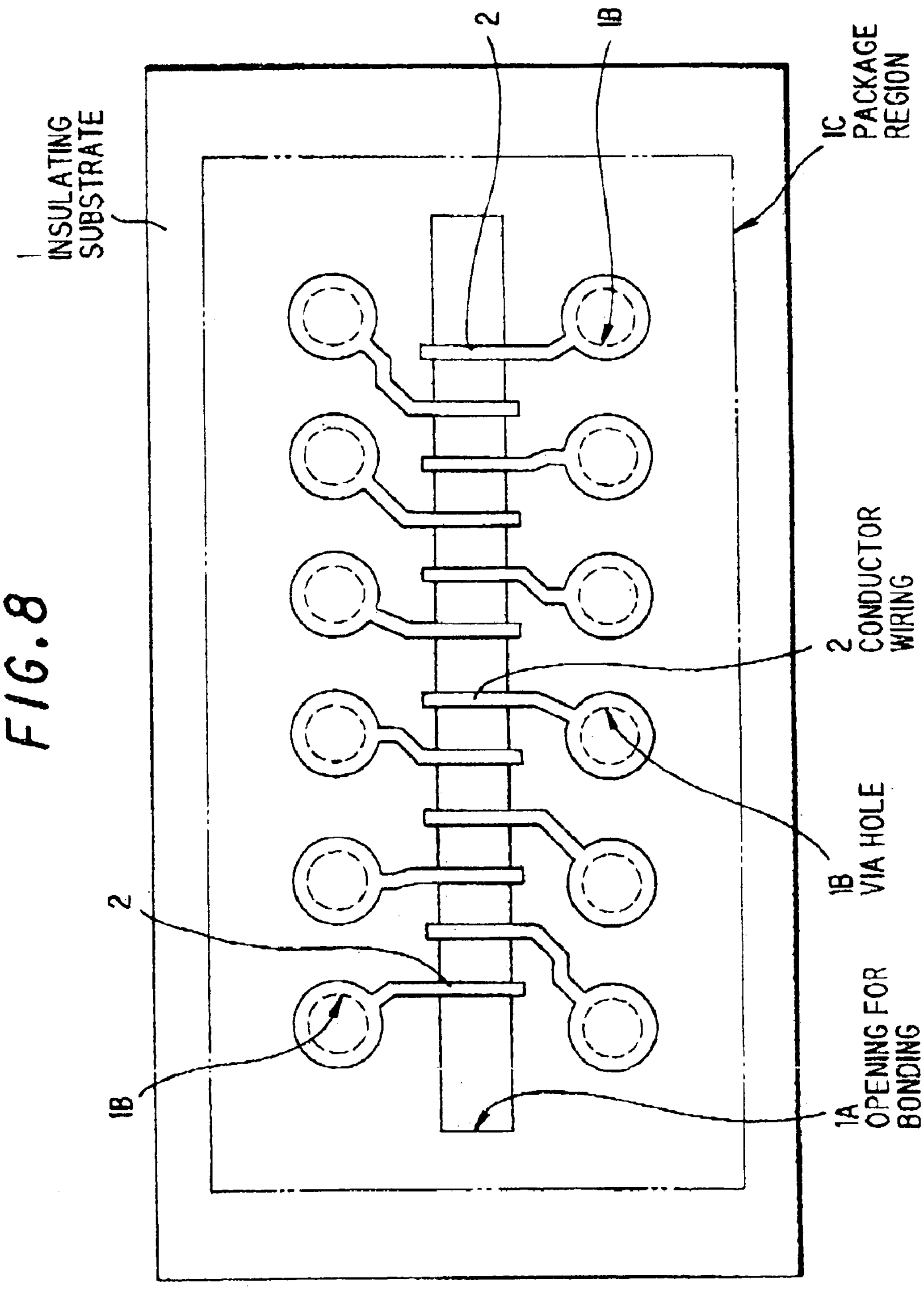
FIG. 8 is a typical schematic plan view showing the construction of a wiring board (an interposer) used in the semiconductor device in the preferred embodiment of the invention, for illustrating a production process of the semiconductor device in the preferred embodiment of the invention.
Figure 9:
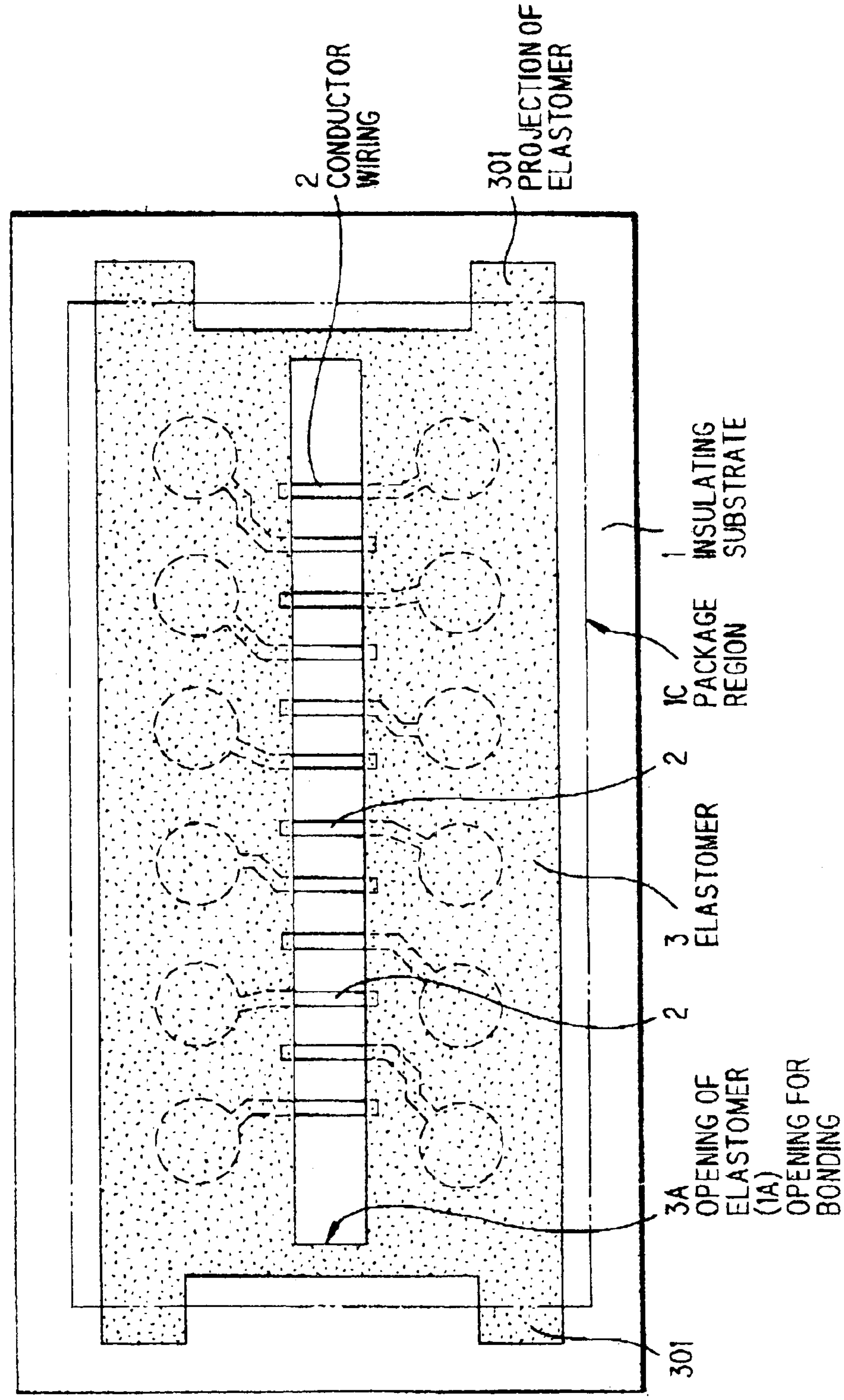
FIG. 9 is a typical schematic plan view showing the construction of a wiring board after bonding of an elastomer, for illustrating a production process of the semiconductor device in the preferred embodiment of the invention.
Figure 10:
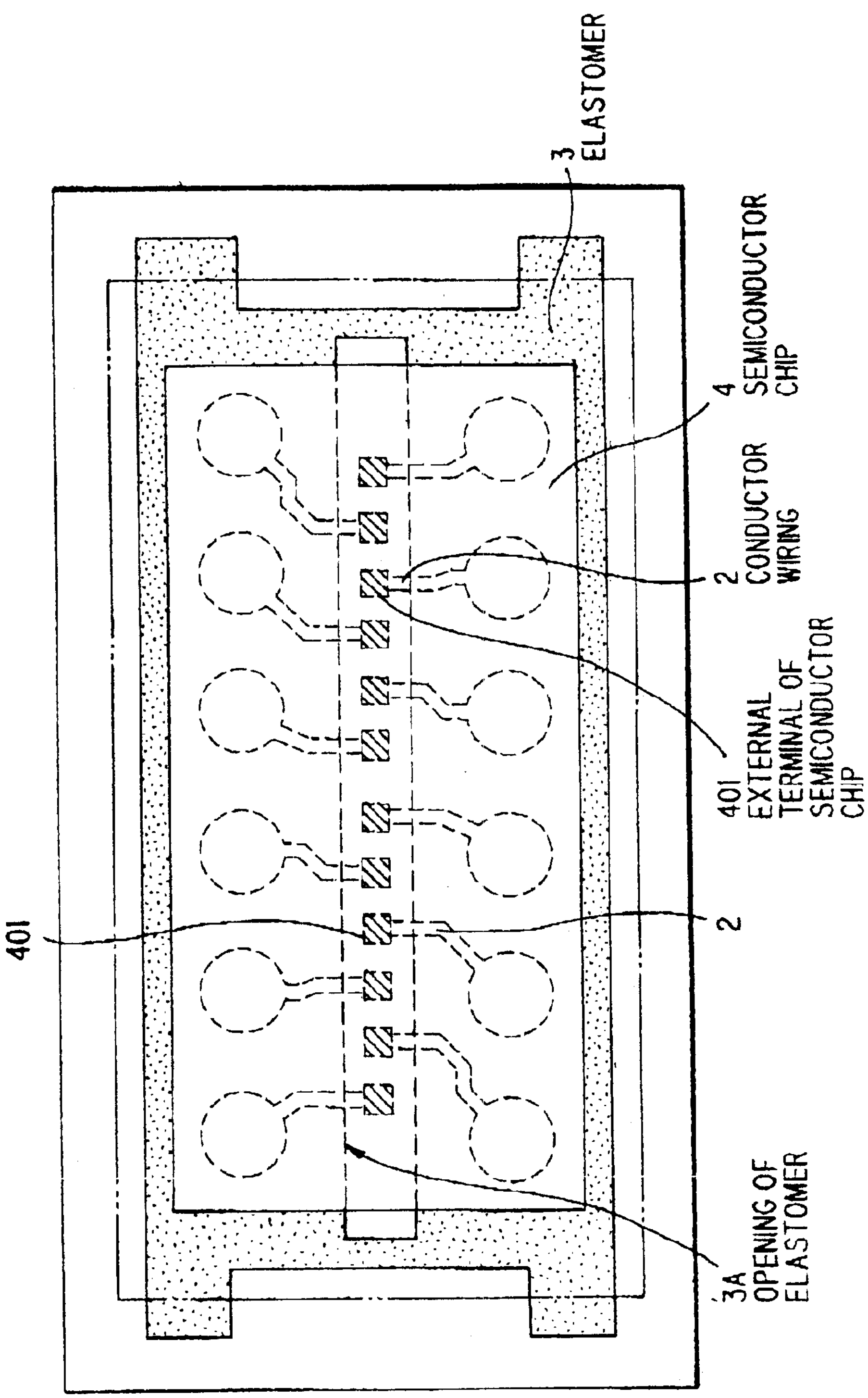
FIG. 10 is a typical schematic plan view showing the construction of a wiring board after bonding of a semiconductor chip, for illustrating a production process of the semiconductor device in the preferred embodiment of the invention.
Figure 11:
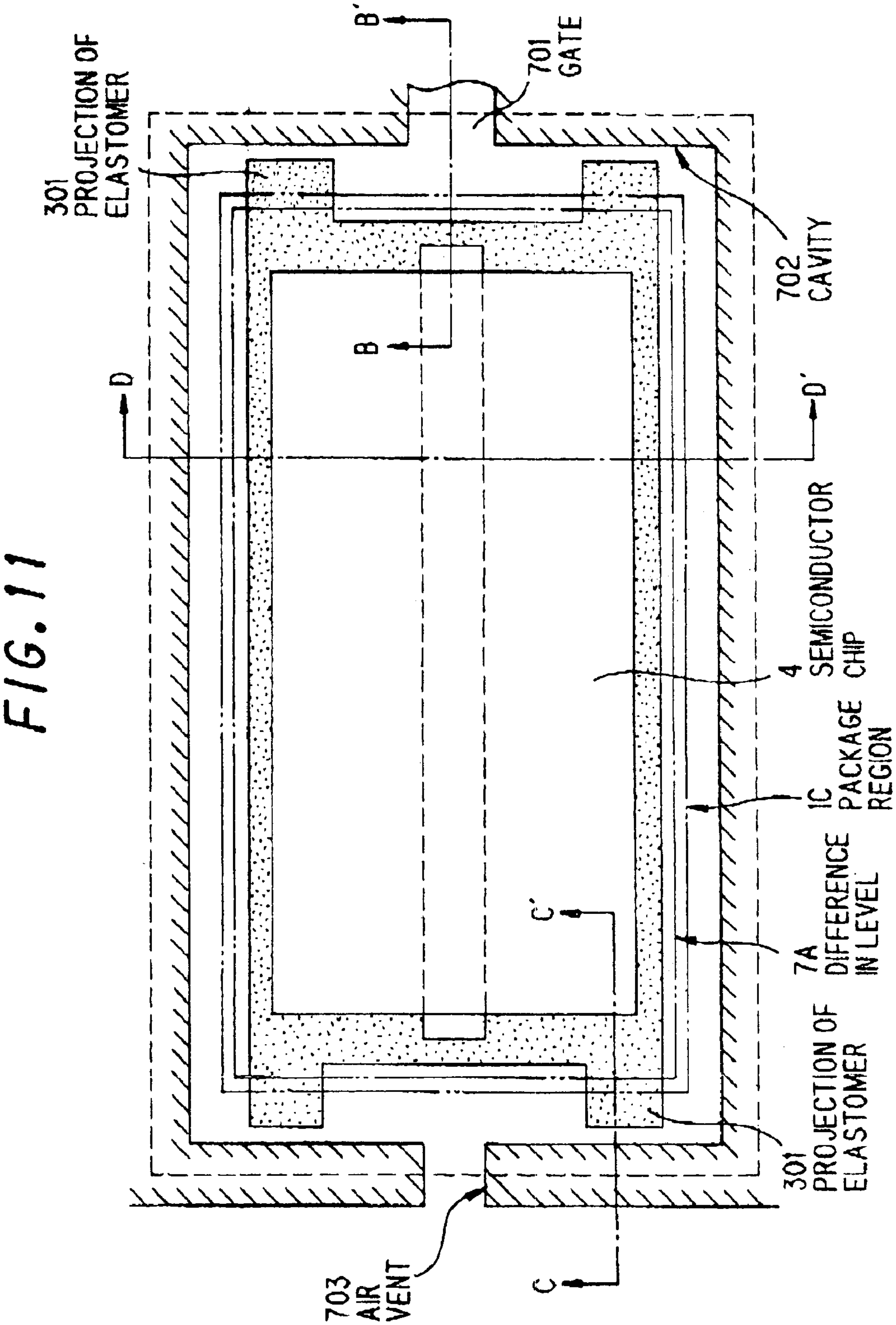
FIG. 11 is a typical plan view showing the step of sealing, for illustrating a production process of the semiconductor device in the preferred embodiment of the invention.
Figure 12A:
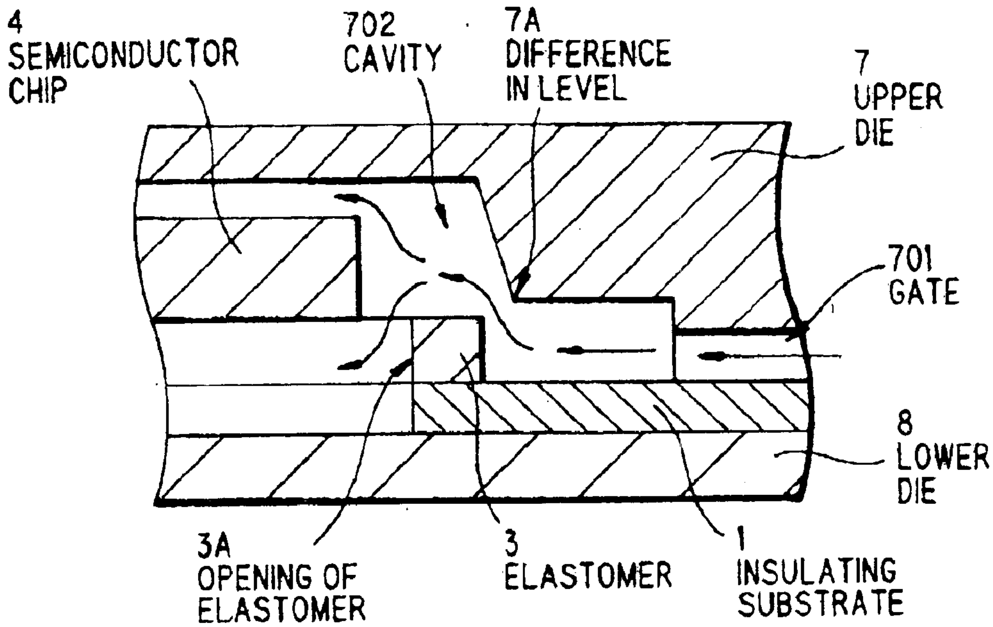
Figure 12B:
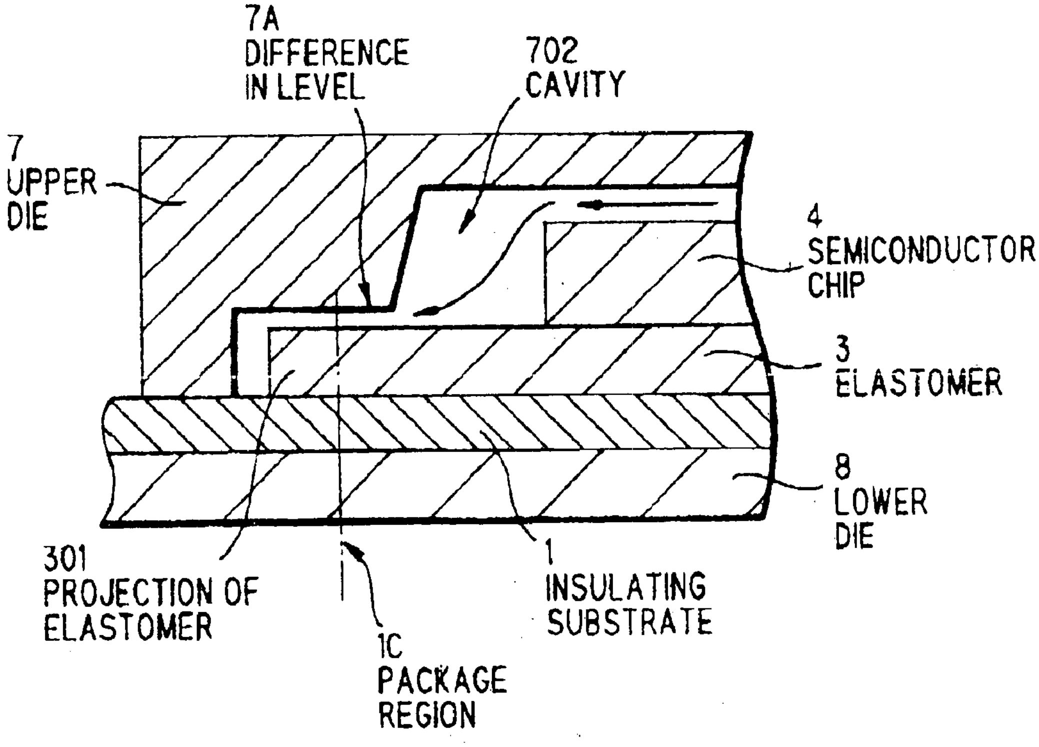
Figure 13:
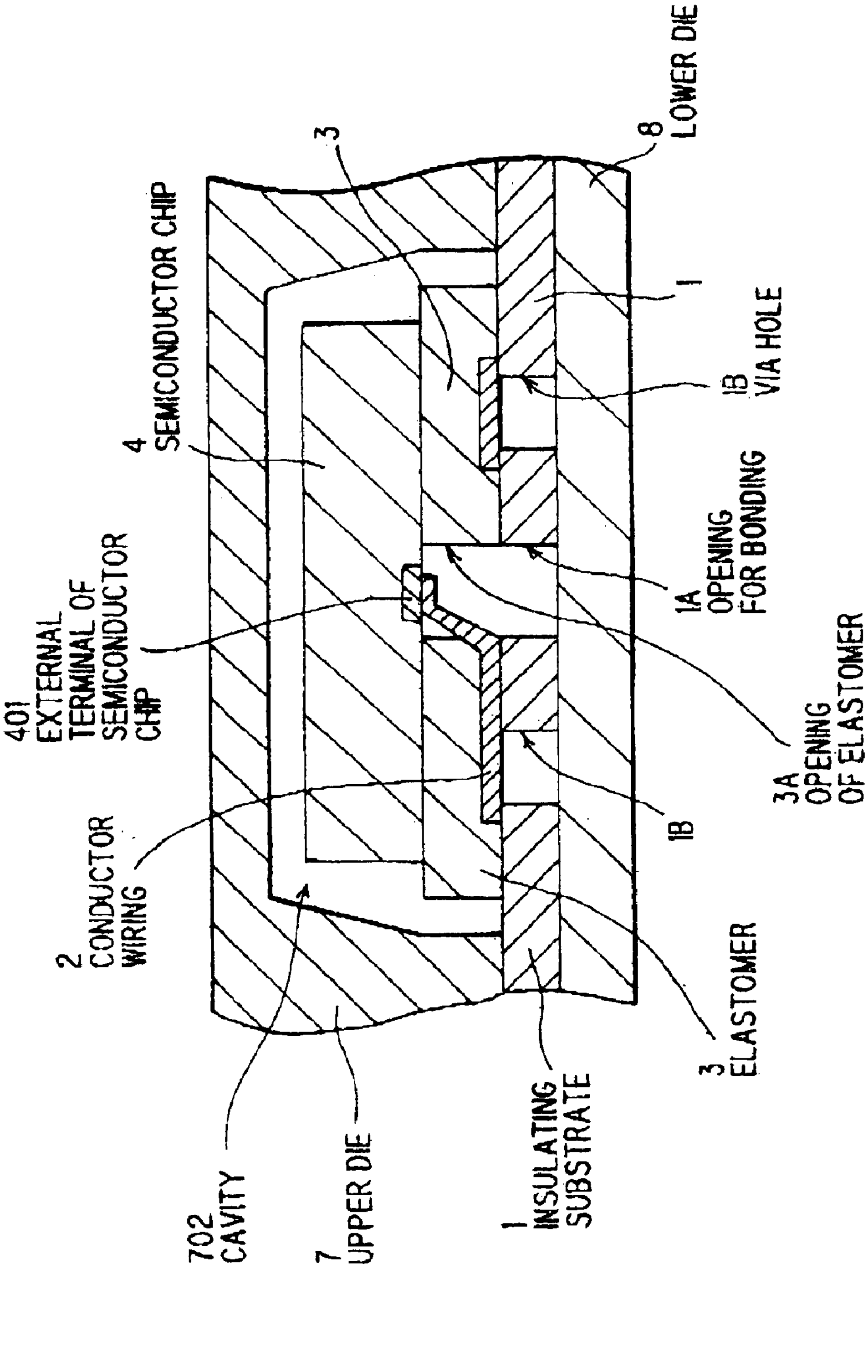
FIG. 13 is a typical cross-sectional view taken on line D–D' of FIG. 11, for illustrating a production process of the semiconductor device in the preferred embodiment of the invention.
Figure 14:
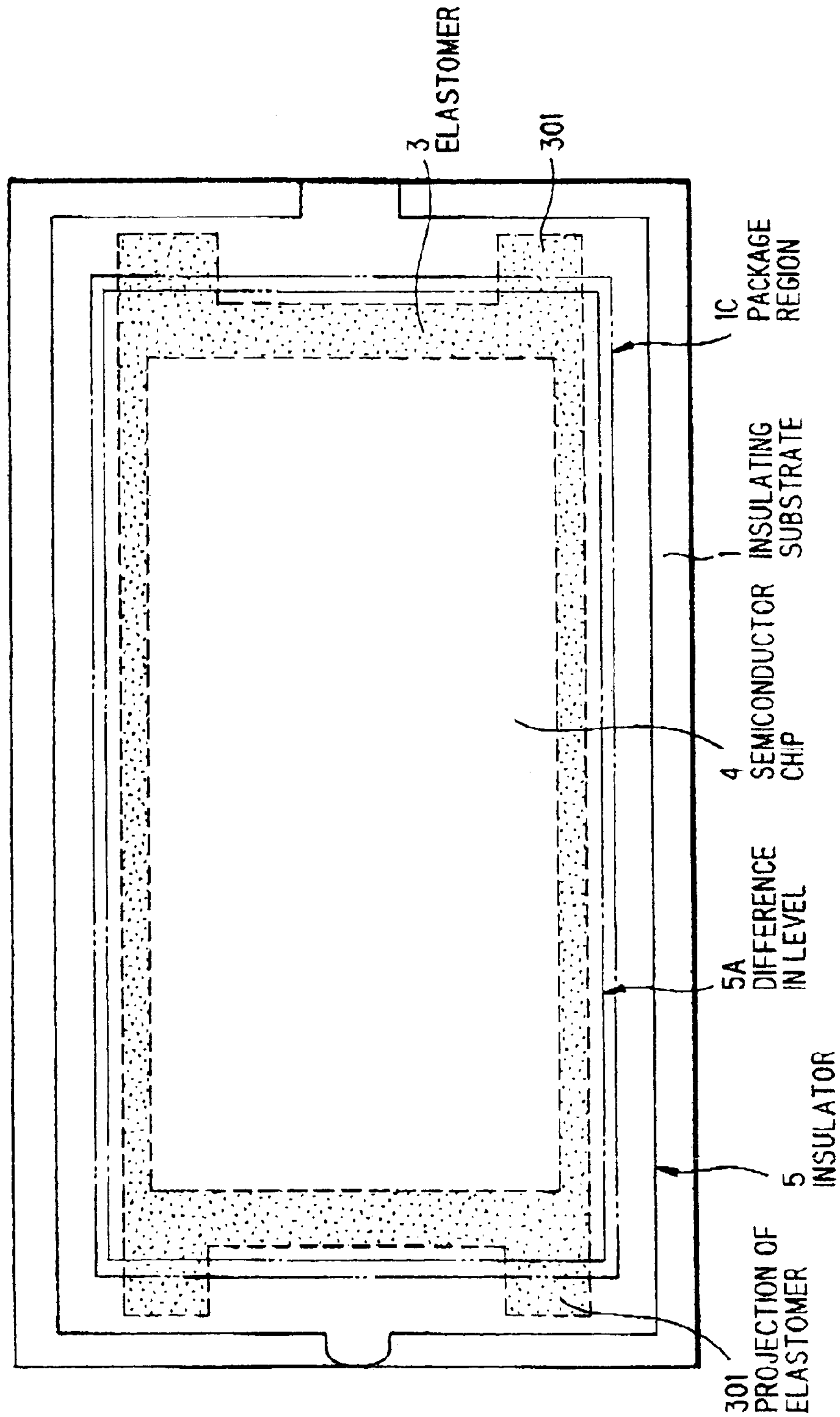
FIG. 14 is a typical schematic plan view showing the construction of a wiring board after the step of sealing, for illustrating a production process of the semiconductor device in the preferred embodiment of the invention.
Figure 15A:
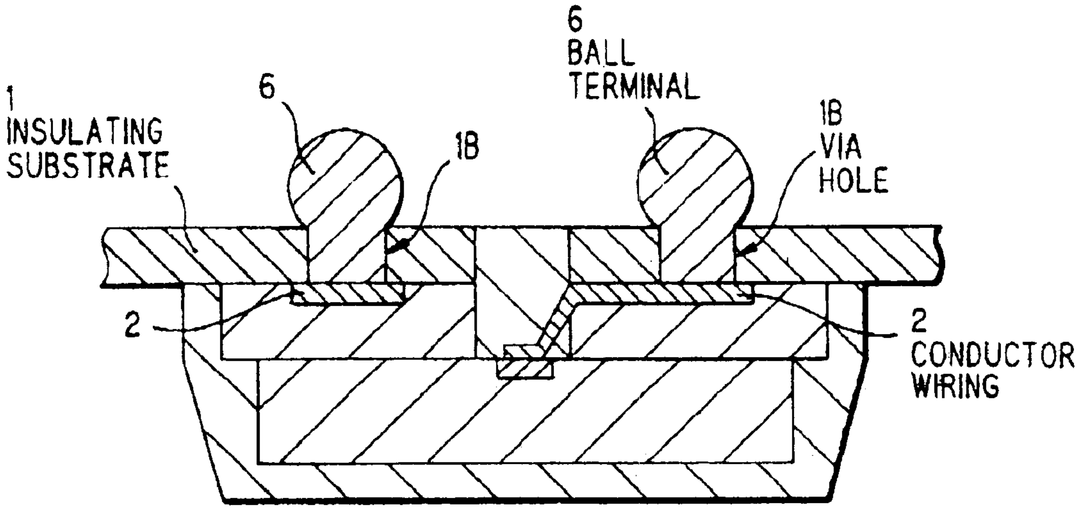
Figure 15B:
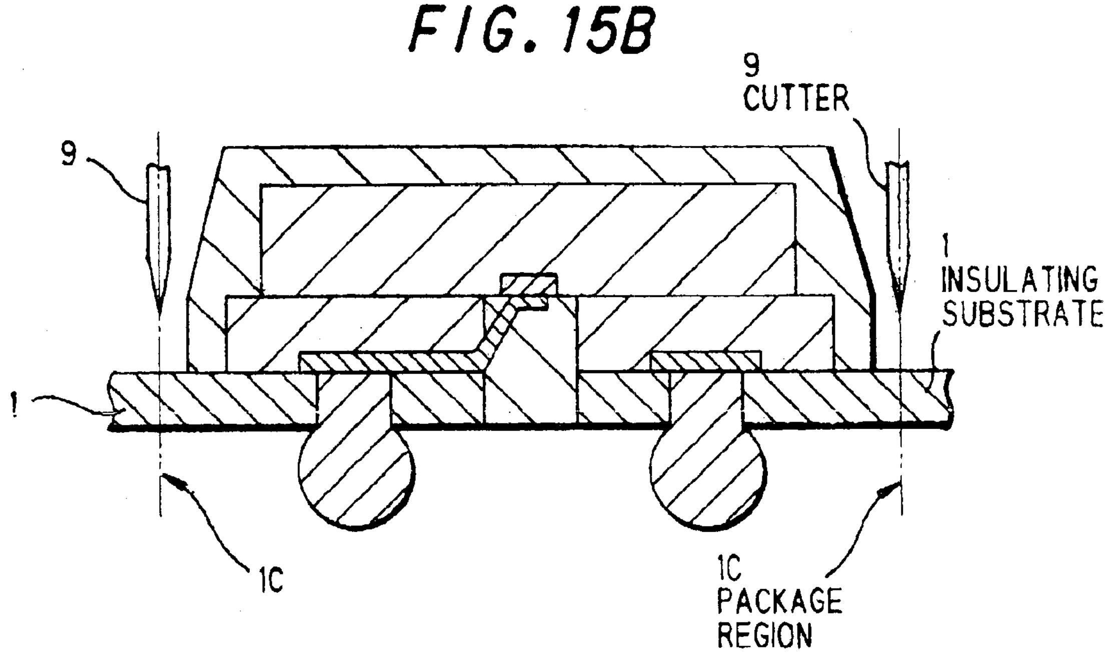
Figure 16A:
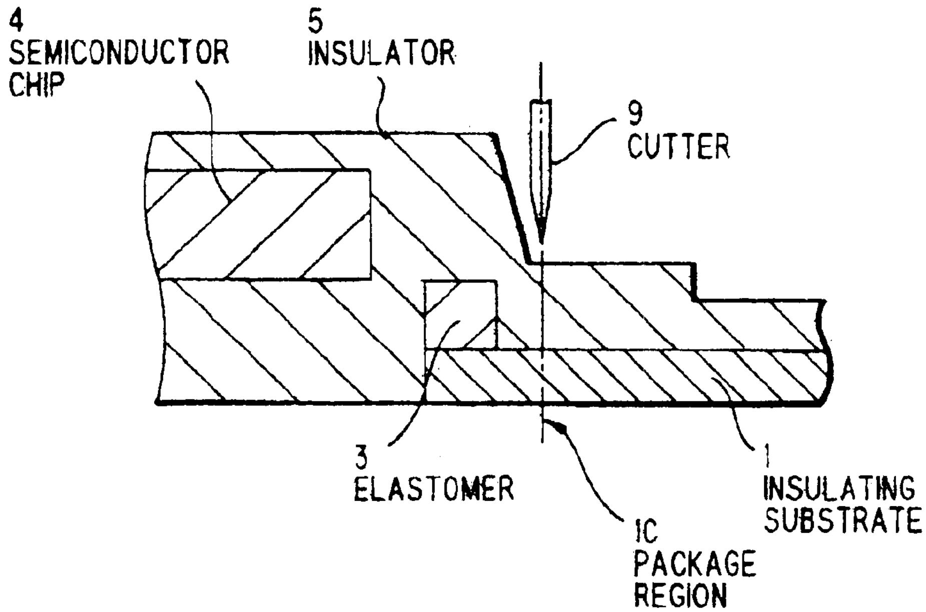
Figure 16B:
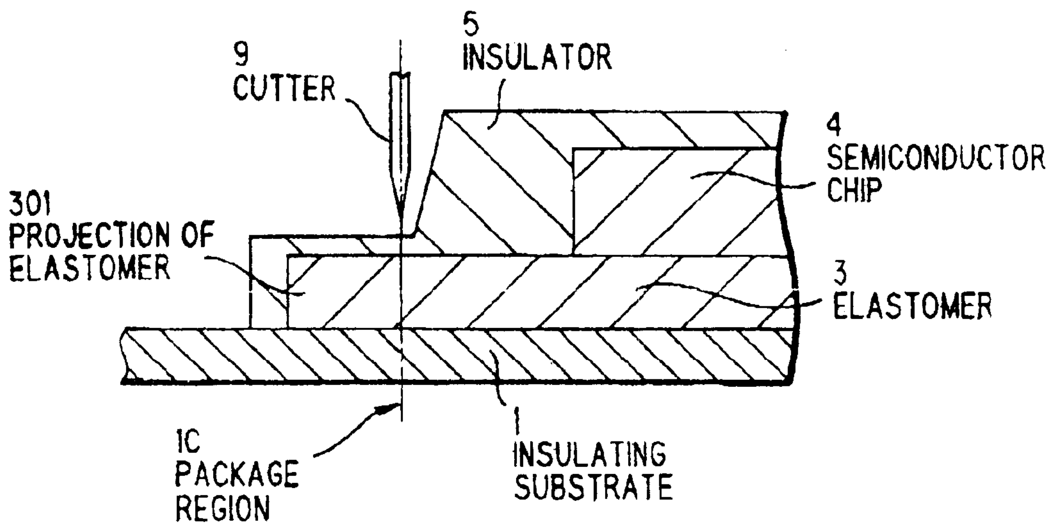

FIGS. 8 to 16 are typical views illustrating a production process of the semiconductor device in the preferred embodiment of the invention, wherein FIG. 8 is a plan view illustrating a method for forming a wiring board, FIG. 9 a plan view showing the step of bonding an elastomer onto the wiring board, FIG. 10 a plan view showing the step of mounting a semiconductor chip, FIG. 11 a plan view showing the step of sealing the semiconductor chip and the elastomer, FIG. 12A a cross-sectional view taken on line B–B' of FIG. 11, FIG. 12B a cross-sectional view taken on line C–C' of FIG. 11, FIG. 13 a cross-sectional view taken on line D–D' of FIG. 11, FIG. 14 a plan view showing the construction of a wiring board after the step of sealing, FIG. 15A a cross-sectional view showing the step of connection of a ball terminal, and FIGS. 15B, 16A, and 16B are cross-sectional views showing the step of cutting the wiring board into individual pieces. FIGS. 15A and 15B are cross-sectional views taken on line D–D' of FIG. 11, FIG. 16A a cross-sectional view taken on line B–B' of FIG. 11, and FIG. 16B a cross-sectional view taken on line C–C' of FIG. 11.

The production process of the semiconductor device in this preferred embodiment of the invention will be explained in conjunction with FIGS. 8 to 16. The detailed explanation of the steps, which are carried out in the same procedure as the steps in the conventional production process, will be omitted.

At the outset, as shown in FIG. 8, a wiring board (an interposer) is formed wherein an opening 1A for bonding and a via hole 1B are formed at respective predetermined positions of the insulating substrate 1 and a conductor wiring 2 is formed on the surface of the insulating substrate 1.

In the wiring board, the opening 1A for bonding and the via hole 1B are formed, for example, by punching using a mold at respective predetermined positions of an insulating substrate 1 such as a polyimide tape or a glass epoxy substrate. Thereafter, a thin conductor layer formed of a copper foil or the like is formed on the surface of the insulating substrate 1, and the thin conductor layer is patterned, for example, by etching to form the conductor wiring 2. Besides the above method, for example, a method may be adopted wherein the opening 1A for bonding and the via hole 1B are formed at respective predetermined positions of the insulating substrate 1, with the thin conductor layer formed thereon, by laser etching using a carbonic gas laser, an excimer laser or the like and the thin conductor layer is then patterned to form the conductor wiring 2.

In this case, as shown in FIG. 8, the conductor wiring 2 is patterned so as to cover the via hole 1B and to be projected into the opening 1A for bonding.

The wiring board may be, for example, such that an insulating substrate 1, such as a polyimide tape, which is continuous in one direction, is provided and a large number of wiring boards are continuously formed on a single insulating substrate by a reel to reel method. In this case, package regions 1C as shown in FIG. 8 are continuously arranged on the insulating substrate 1 in a tape form, and semiconductor chips are mounted to form semiconductor devices, followed by cutting at the package regions 1C into individual pieces.

Next, in the step of bonding an elastomer, as shown in FIG. 9, an elastomer 3 is bonded onto each package region 1C in the wiring board. In this case, as shown in FIG. 9, the elastomer 3 is bonded so that the moisture vent portion 301 is projected into a portion which is outside the package region 1C. Further, in the elastomer 3, an opening 3A is provided at a position corresponding to the opening 1A for bonding in the insulating substrate 1.

Next, in the step of bonding a semiconductor chip, as shown in FIG. 10, a semiconductor chip 4 is disposed on the elastomer 3, the semiconductor chip in its external terminal 401 is registered with and bonded to the conductor wiring 2. Thereafter, in the step of wiring connection, the conductor wiring 2 in its portion projected into the openings 1A, 3A for bonding is press cut with a bonding tool, deformed, and connected to the semiconductor chip in its external terminal 401.

Figure 5A:
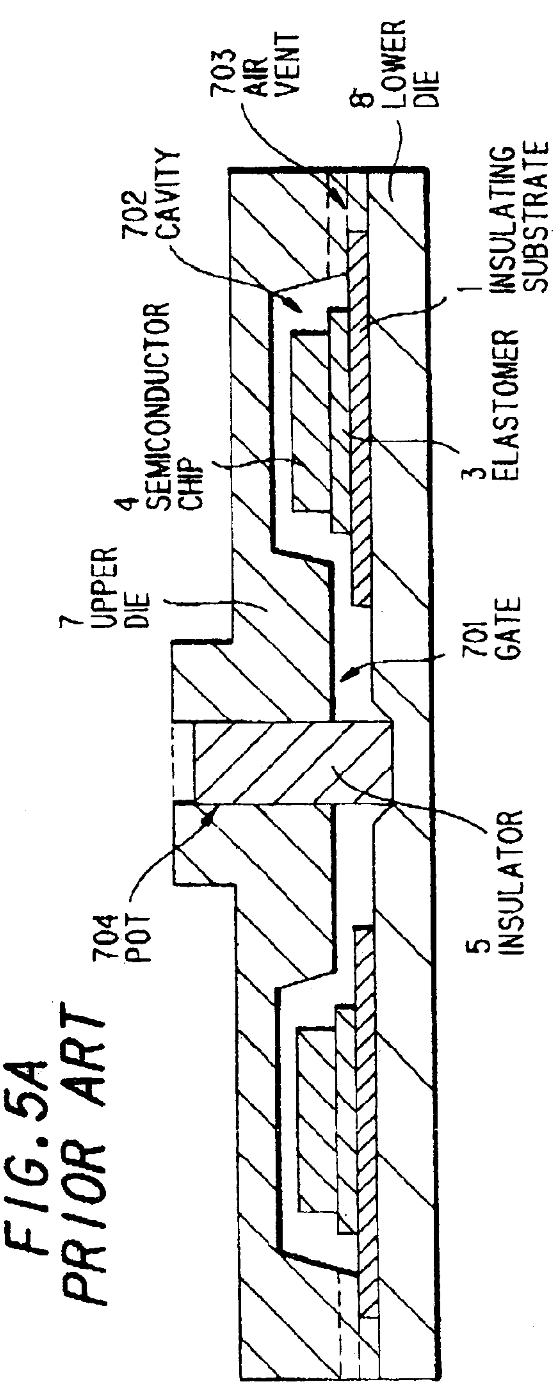
FIGS. 5A and 5B are typical cross-sectional views showing the step of sealing a semiconductor chip in a production process of a conventional semiconductor device.
Figure 5B:
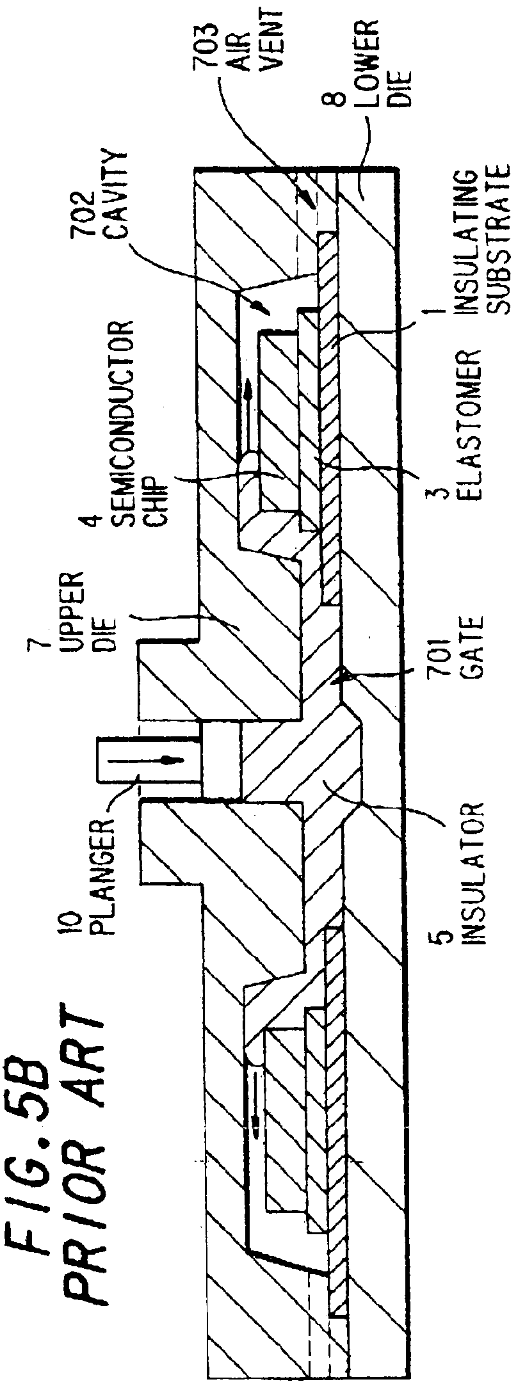

Next, in the step of sealing, the semiconductor chip 4 and the elastomer 3 and the connection between the conductor wiring 2 and the semiconductor chip in its external terminal 401 are sealed. In this preferred embodiment, sealing by transfer molding using a mold will be explained. In the case of transfer molding, a wiring board, on which the semiconductor chip 4 has been flip chip mounted through the elastomer 3, is sandwiched and fixed between an upper die 7 and a lower die 8 as shown in FIG. 5, the insulator 5, which has been heat melted in the pot 704, is poured into a cavity 702. In this case, as shown in FIGS. 11, 12A, and 12C, the cavity 702 in the upper die 7 is constructed so that a difference in level 7A is provided in the cavity 702 as a space for receiving the semiconductor chip 4 and the elastomer 3 and the distance from the elastomer 3 in its the moisture vent portion 301 to the wall of the cavity 702 is smaller than the distance from the elastomer 3 to the wall of the the cavity 702 on the semiconductor chip 4. Further, in this case, the height of the difference in level 7A is set so that a gap of about 5 to 100 $\mu$m is provided, because the contact of the cavity 702 with the moisture vent portion 301 of the elastomer possibly causes the adhesion of the adhesive layer in the elastomer 3 to the upper die 7.

After the wiring board is sandwiched and fixed between the upper die 7 and the lower die 8, upon pressing of the insulator 5, melted in the pot, by means of a plunger, as shown in FIG. 12A, the insulator 5 flows through the gate 701 into the cavity 702. At that time, the insulator 5, which has flowed into the cavity 702, flows through a space on the semiconductor chip 4 to seal the semiconductor chip 4 and the elastomer 3. At the same time, a part of the insulator 5 flows into the opening 3A of the elastomer 3 to seal the connection between the conductor wiring 2 and the semiconductor chip in its external terminal 401. At that time, since each opening in the insulating substrate 1 is closed by the lower die 8 in a flat plate form, there is no possibility that the insulator 5, which flows within the opening 1A for bonding, flows to the outside of the opening 1A and clogs the via hole 1B.

As shown in FIG. 12B, the insulator 5 flows through the cavity 702, and the cavity 702 is filled with the insulator 5. The insulator 5 reaches the air vent 703 side. At that time, the air within the cavity 702 is discharged through the air vent 703.

After the cavity 702 is filled with the insulator 5, the insulator 5 is cured, and the assembly is removed from the mold. Thus, as shown in FIG. 14, the periphery of the semiconductor chip 4 and the elastomer 3 is sealed with the insulator 5.

Next, as shown in FIG. 15A, a ball terminal 6 formed of, for example, a Pb—Sn-base solder is connected to the via hole 1B in the insulating substrate 1, followed by the step of separation into individual pieces wherein the insulating substrate 1 is cut to take off packages regions 1C, thereby preparing individual pieces.

In the step of separation into individual pieces, for example, when the long side direction of the package region 1C is cut, for example, as shown in FIG. 15B, cutting only the insulating substrate 1 with a dicing cutter 9 suffices for this purpose. On the other hand, when cutting the short side direction of the package region 1C is contemplated, as shown in FIGS. 16A and 16B, a combination of the insulating substrate 1 and the insulator 5 or a combination of the insulating substrate 1, the moisture vent portion 301 of elastomer, and the insulator 5 should be cut with a cutter 9. In this case, when the package region 1 on its side, in which the moisture vent portion 301 is provided, is cut, a load is applied to the cutter 9. Accordingly, preferably, as shown in FIG. 16B, a difference in level 7A is provided in the cavity 702 in the upper die 7 so that the insulator 5 on the moisture vent portion 301 is made as thin as possible to minimize the load applied to the cutter 9.

An example of a method other than cutting with a dicing cutter 9 used in the step of separation into individual pieces is cutting by punching using a mold or the like. In the case of cutting by punching, however, when the thickness of the insulator 5 on the moisture vent portion 301 is large, the load applied at the time of punching is so large. This disadvantageously leads to a possibility that the cut face is rough, or the elastomer 3 is separated through the action of an impact applied at the time of punching. For this reason, when cutting by punching is used, preferably, the thickness of the insulator 5 on the projection is not more than 100 μm.

Figure 17A:
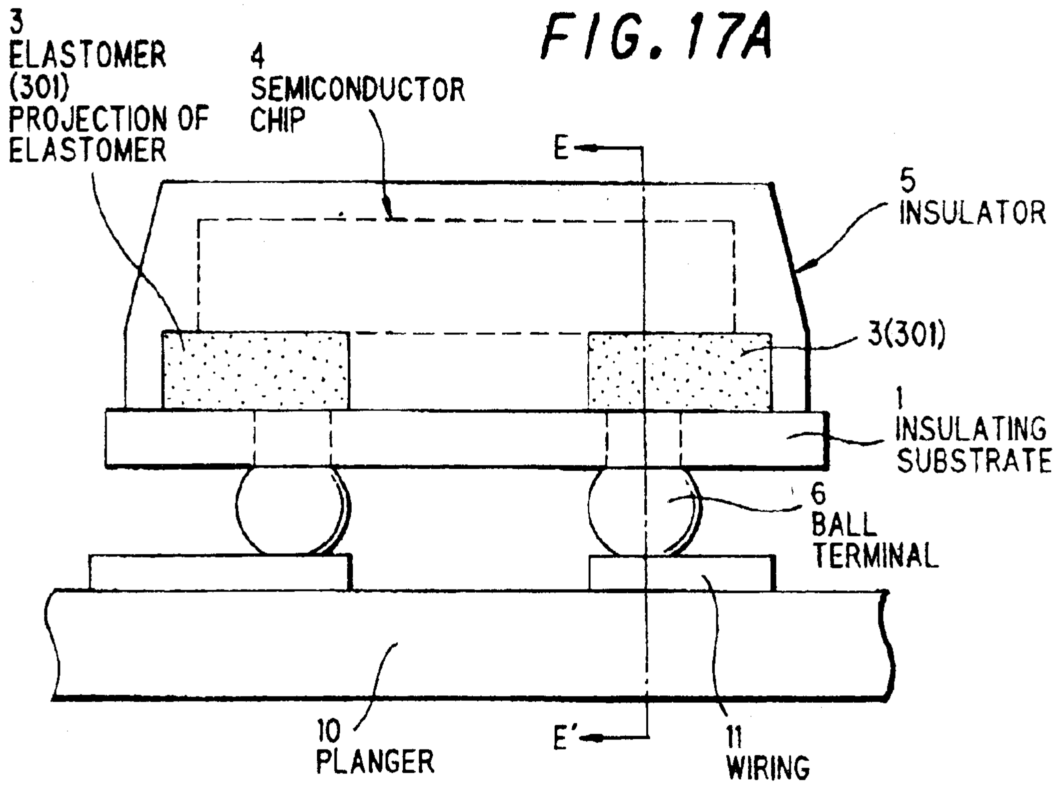
Figure 17B:
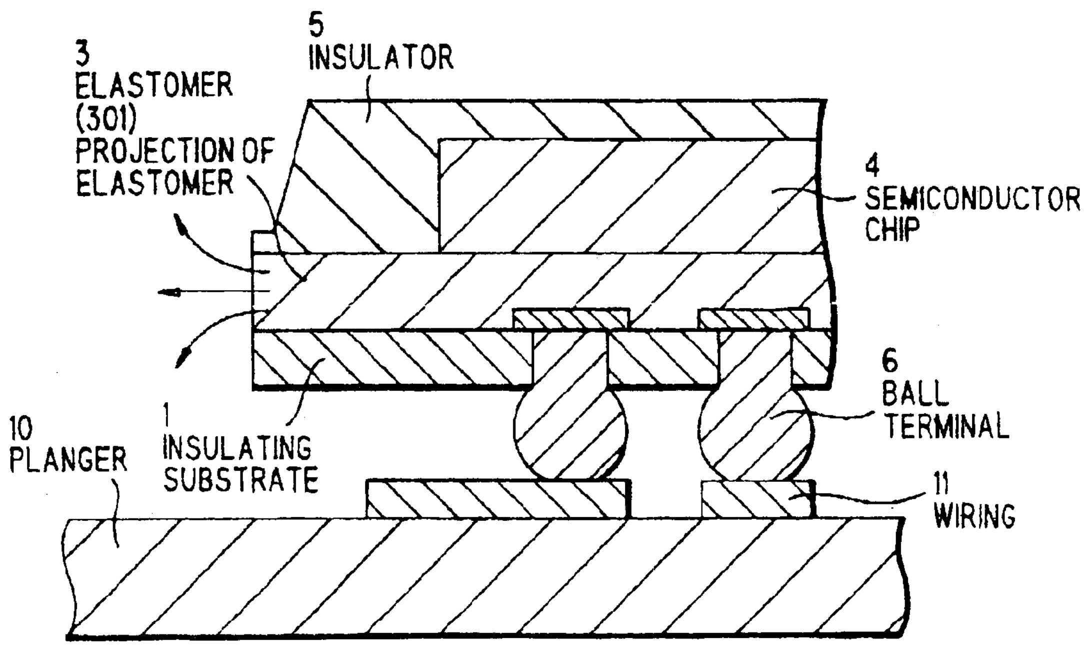

FIGS. 17A and 17B are typical views illustrating the effect and function of the semiconductor device in the preferred embodiment, wherein FIG. 17A is a side view showing the step of mounting a semiconductor device on a mounting substrate and FIG. 17B a cross-sectional view taken on line E–E' of FIG. 17A.

In mounting the semiconductor device in the preferred embodiment produced according to the above procedure on a mounting substrate, for example, as shown in FIG. 17A, a wiring (a terminal) 11 provided on an insulating substrate 10 is registered with the ball terminal 6 in the semiconductor device, and the ball terminal 6 is then melted by heating and connected to the wiring 11. At that time, when the whole elastomer 3 is the state of being sealed with the insulator 5, a space for escape of water, which has been incorporated into the elastomer 3 and vaporized or expanded, cannot be ensured. In this case, the semiconductor chip 4 or the interposer is sometimes separated due to thermal shock or the like. The separation of the semiconductor chip 4 or the interposer caused by thermal shock or the like can be prevented by the semiconductor device in the preferred embodiment wherein, as shown in FIG. 17B, the moisture vent portion 301 of the elastomer is exposed to the surface of the insulator 5 to release the water incorporated into the elastomer 3 to the outside of the semiconductor device through the moisture vent portion 301.

Further, in the construction wherein the moisture vent portion 301 of the elastomer is exposed onto the surface of the insulator 5 so as to release water incorporated into the elastomer 3 to the outside of the semiconductor device, it is possible to prevent an unfavorable phenomenon such that the water incorporated into the elastomer 3 reaches metal portions such as the conductor wiring 2 in the wiring board or the internal wiring in the semiconductor chip 4 and attacks the metal portions. Thus, the production of a semiconductor device according to the procedure in the preferred embodiment can realize the production of a semiconductor device having a reduced deterioration in electrical characteristics.

Further, the partial exposure of the elastomer 3 can offer an additional advantage that, as compared with the case where the periphery of the semiconductor chip 4 and the elastomer 3 is not sealed, the amount of water absorbed in the elastomer 3 can be reduced. Therefore, the separation of the elastomer 3 by moisture absorption and a deterioration in electrical characteristics can be reduced.

As described above, according to the preferred embodiment, in a semiconductor device wherein the semiconductor chip 4 is mounted on the wiring board (interposer) through the elastomer 3 and the periphery of the semiconductor chip 4 and the elastomer 3 is sealed with the insulator 5, a part of the elastomer 3 is exposed onto the surface of the insulator 5. By virtue of this construction, after sealing of the semiconductor chip 4 with the insulator 5, water incorporated into the elastomer 3 can be released to the outside of the semiconductor device. Therefore, the separation of the semiconductor chip 4 or the wiring board (insulating substrate 1) caused, for example, by thermal shock created by vaporization or expansion of water incorporated into the elastomer 3 can be reduced. This can improve the reliability of the semiconductor device.

Further, since the water incorporated into the elastomer 3 can be released to the outside of the semiconductor device, the corrosion of metal portions such as the conductor wiring 2, the semiconductor chip 4 in its internal wiring or the like by the water incorporated into the elastomer 3 can be prevented. This contributes to the prevention of a deterioration in electrical characteristics of the semiconductor device.

As explained in connection with this preferred embodiment, sealing of the periphery of the semiconductor chip by transfer molding using a mold can prevent damage to the semiconductor chip or breaking of the corner portion of the semiconductor chip.

Further, when sealing by the transfer molding is adopted, the outward form or the insulator 5 becomes flat and, in addition, each semiconductor device can have a uniform shape. This can improve the handleability of the semiconductor device.

When a difference in level 7A is provided around the elastomer in its projection 301 within the cavity 702 in the upper die 7 to reduce the gap left on the projection 301, in cutting the wiring board into individual pieces, the load applied to the dicing cutter 9 can be reduced and, at the same time, roughening of the cut face can be prevented.

Figure 18:
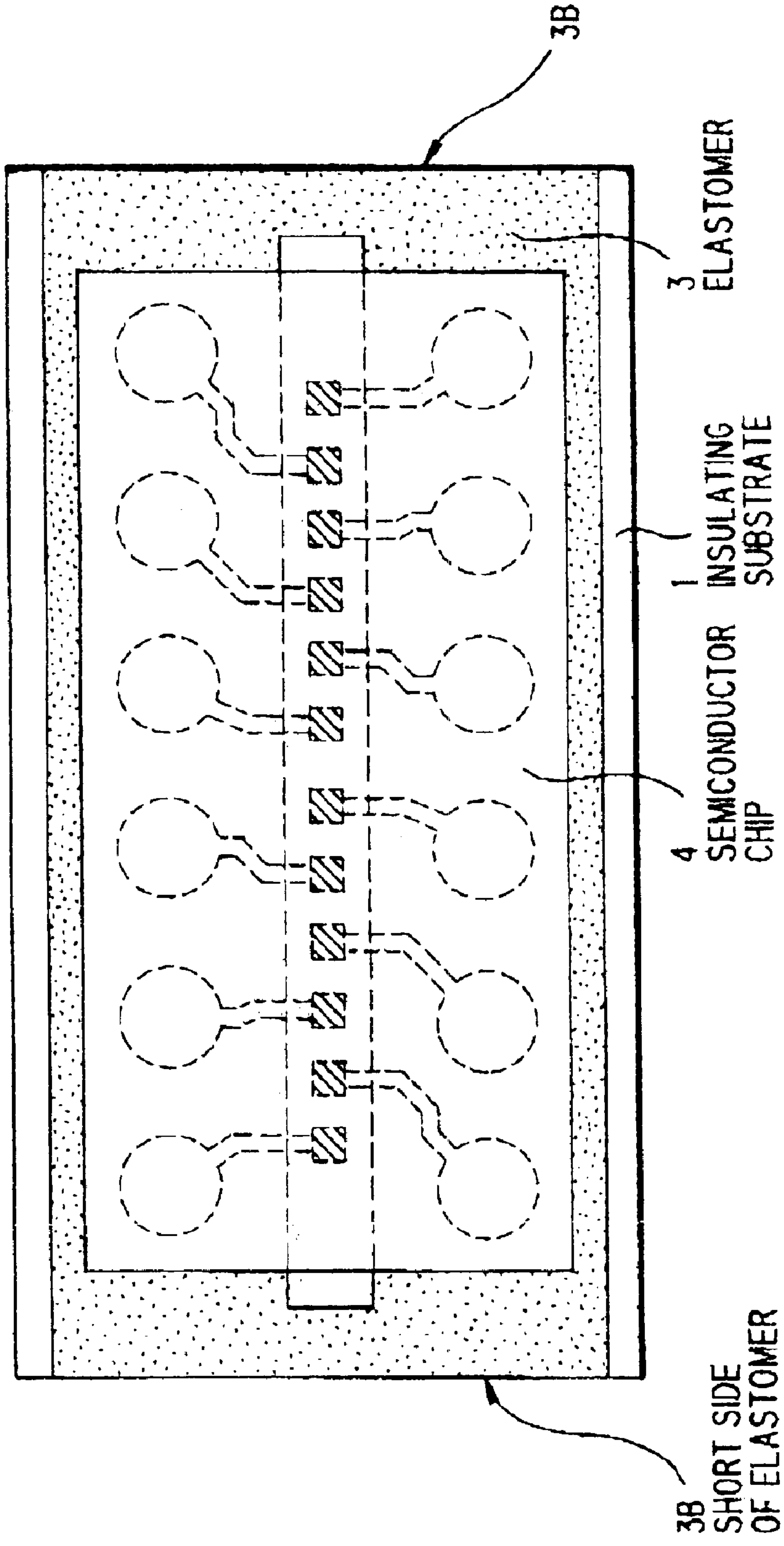
FIG. 18 is a typical schematic plan view showing the construction of a semiconductor device in a first variant of the semiconductor device in the preferred embodiment of the invention.
Figure 19:
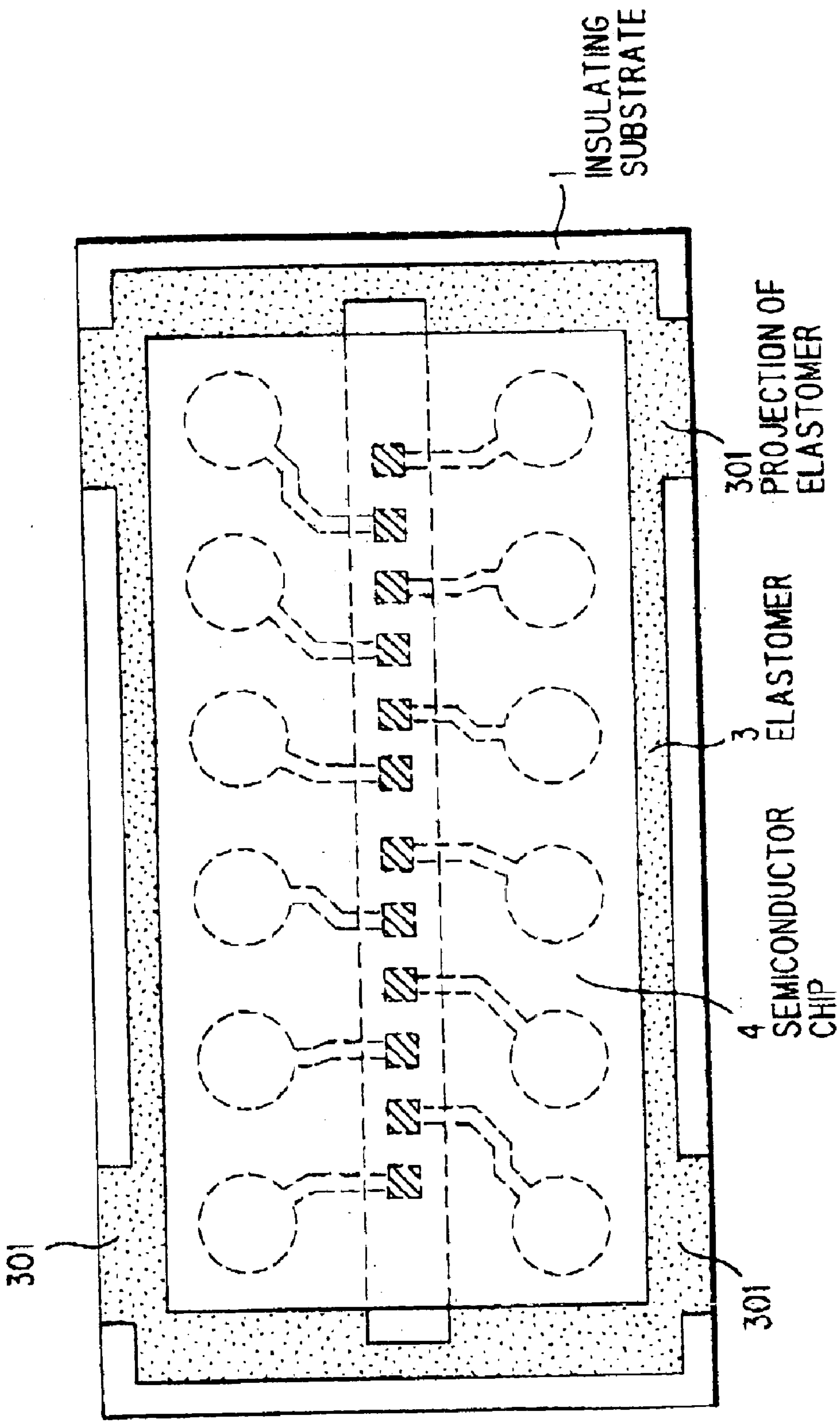
FIG. 19 is a typical schematic plan view showing the construction of a semiconductor device in a second variant of the semiconductor device in the preferred embodiment of the invention.

FIGS. 18 and 19 are typical views illustrating a variant of the semiconductor device in the preferred embodiment of the invention. Specifically, FIG. 18 is a typical schematic plan view showing the construction of the semiconductor device in the first variant, and FIG. 19 a typical schematic plan view showing the construction of the semiconductor device in the second variant. In FIGS. 18 and 19, the insulator for sealing the semiconductor chip and the elastomer is not shown.

In the semiconductor device in the preferred embodiment, as shown in FIG. 6, the moisture vent portion 301 is provided in the short side direction of the elastomer 3 and is exposed onto the surface of the insulator 5. The construction, however, is not limited to this only. For example, as shown in FIG. 18, a construction may be adopted wherein, without the provision of the moisture vent portion 301, the whole short side 3B of the elastomer 3 extends to the short side of the insulating substrate 1 so as to be exposed onto the surface of the insulator 5. In this case, as compared with the semiconductor device shown in FIG. 6, the exposed area of the elastomer 3 is larger. By virtue of this, after sealing of the semiconductor chip 4 and the elastomer 3, the efficiency of release of water incorporated into the elastomer 3 can be improved.

Further, in the semiconductor device shown in FIGS. 6 and 18, the short side direction of the elastomer 3 is exposed onto the surface of the insulator 5. Instead of this construction, for example, a construction may be adopted wherein, as shown in FIG. 19, the moisture vent portion 301 is provided in the long side direction of the elastomer 3 so as to be exposed onto the surface of the insulator 5. Also in this case, by virtue of the exposure of a part (moisture vent portion 301) of the elastomer 3 onto the surface of the insulator 5, after sealing of the semiconductor chip 4 and the elastomer 3, water incorporated into the elastomer 3 can be released, and, as with the semiconductor device in the above preferred embodiment, the reliability of the device can be improved. Further, needless to say, other constructions not shown in the drawing can be adopted, and examples thereof include a construction wherein the whole long side of the elastomer 3 is exposed onto the surface of the insulator 5, a construction wherein all of four sides of the elastomer 3 is exposed onto the surface of the insulator 5, and a construction wherein the moisture vent portion 301 is provided on a predetermined side and is exposed onto the surface of the insulator 5.

Figure 20:
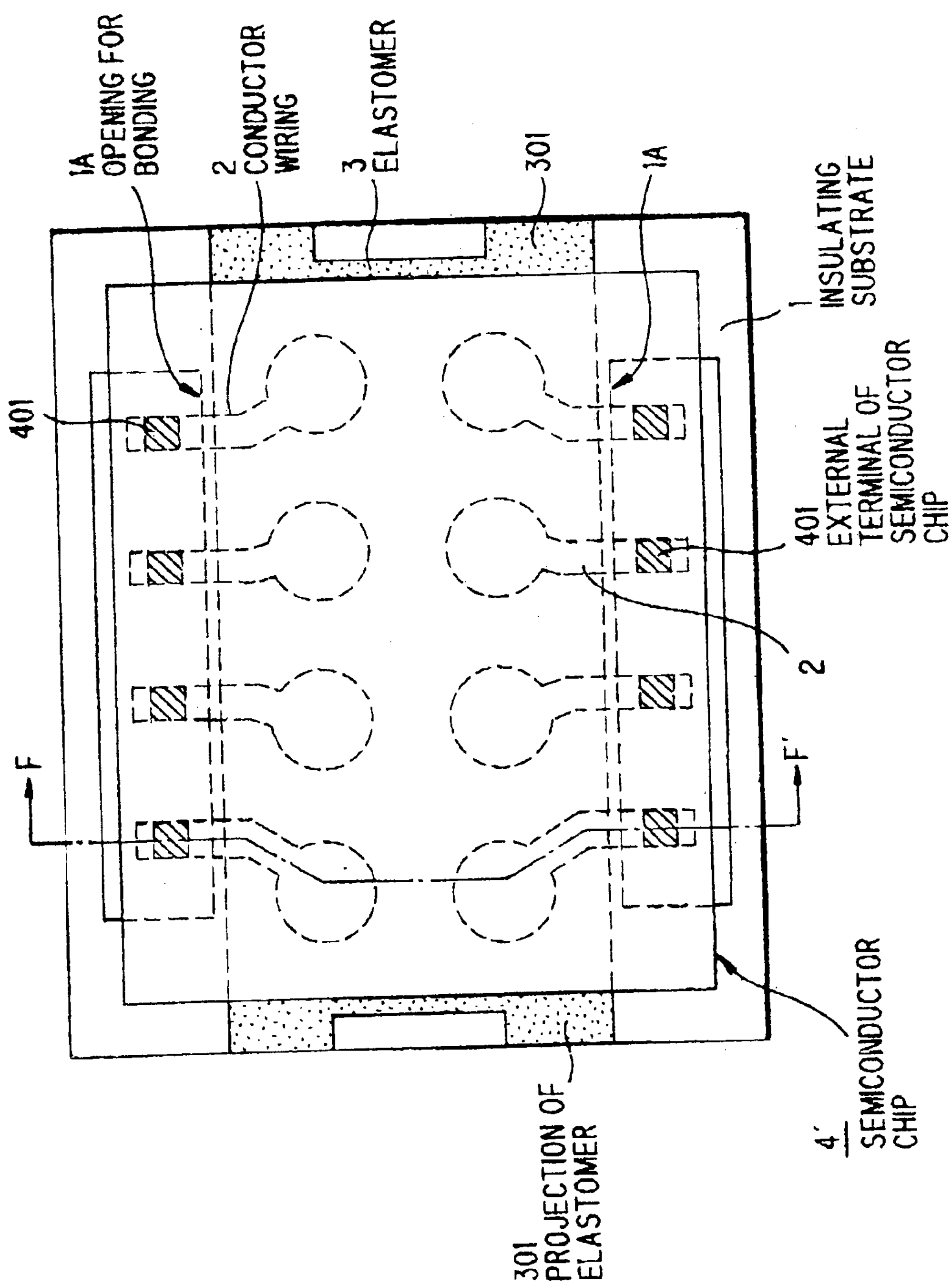
FIG. 20 is a typical schematic plan view showing the construction of a semiconductor device in a third variant of the semiconductor device in the preferred embodiment of the invention.
Figure 21A:
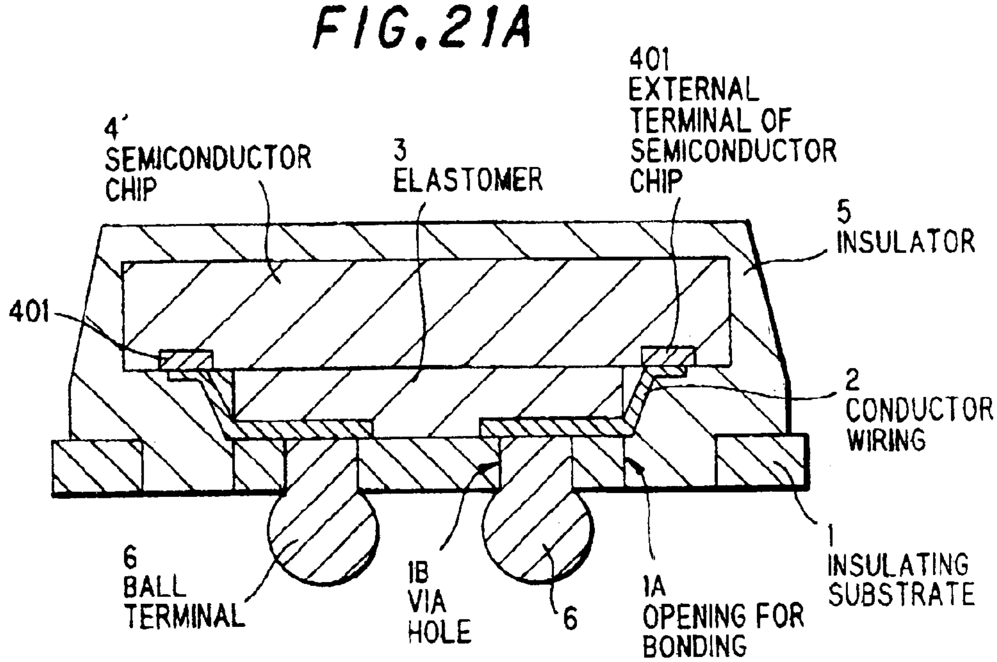
Figure 21B:
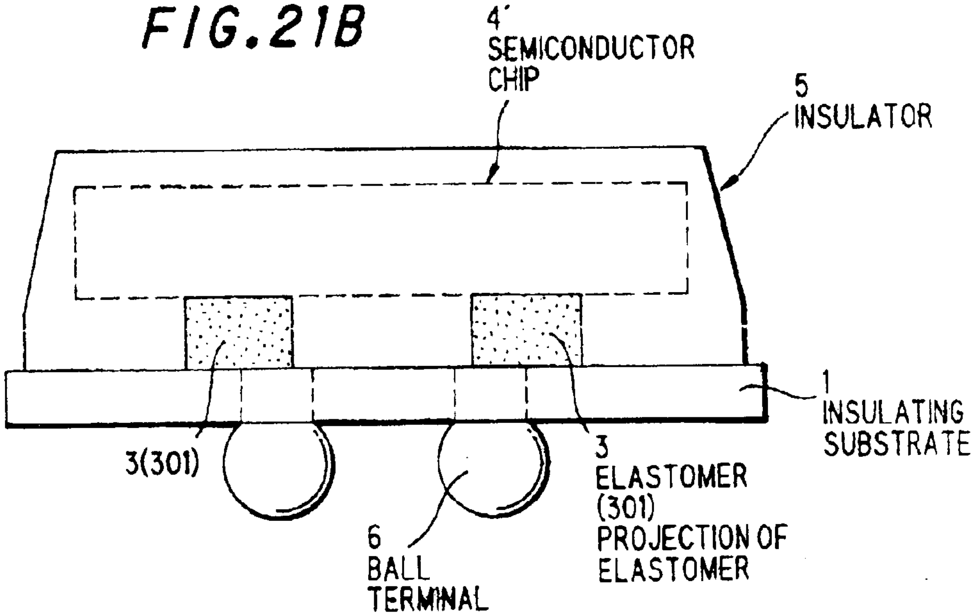

FIGS. 20 and 21 are typical views illustrating other variant of the semiconductor device in the preferred embodiment. Specifically, FIG. 20 is a typical schematic plan view showing the construction of a semiconductor device in the third variant. FIG. 21A a typical cross-sectional view taken on line F–F' of FIG. 20, and FIG. 21B a right side view of FIG. 20.

In the semiconductor device in the preferred embodiment, a center pad-type semiconductor chip such as DRAM is used as the semiconductor chip which is to be mounted on the wiring board (interposer) through the elastomer 3. The semiconductor chip, however, is not limited to this only, and, for example, as shown in FIGS. 20 and 21A, a peripheral pad-type semiconductor chip 4' may be used wherein external terminal 401 is provided along a short portion in the long side of the silicon substrate with a circuit provided thereon.

The semiconductor device shown in FIGS. 20 and 21A may be produced by the same production process as explained in the above preferred embodiment. Specifically, at the outset, a wiring board (an interposer) is provided which comprises: the insulating substrate 1, such as a polyimide tape, provided with an opening 1A for bonding and a via hole 1B; and the conductor wiring 2 provided on the surface of the insulating substrate 1. A semiconductor chip 4 is bonded onto the wiring board through an elastomer 3 having a projection 301 extended to the outside of the package region in the insulating substrate 1, and the wiring conductor 2 is connected to the semiconductor chip in its external terminal 401. Thereafter, the periphery of the semiconductor chip 4 and the elastomer 3 and the connection between the wiring conductor 2 and the semiconductor chip in its external terminal 401 is sealed with the insulator 5 by transfer molding using a mold. A ball terminal 6 is connected to the via hole 1B in the insulating substrate 1, and predetermined regions (package regions) in the wiring board are taken off to prepare individual pieces.

Also in this case, as shown in FIGS. 20 and 21B, by the provision of the moisture vent portion 301 on the short side of the elastomer 3 to expose the moisture vent portion 301 onto the surface of the insulator 5, after sealing of the semiconductor chip and the elastomer 3, water incorporated into the elastomer 3 can be released. Thus, as with the semiconductor device in the above preferred embodiment, the reliability of the device can be improved.

The effects of the invention will be summarized.

(1) A lowering in device reliability can be prevented in a semiconductor device comprising a semiconductor chip, which has been mounted on a wiring board (an interposer) through an elastomer, and an insulator with which the periphery of the semiconductor chip has been sealed.

(2) A device failure caused by the separation of a semiconductor chip or a wiring board can be reduced in a semiconductor device comprising a semiconductor chip, which has been mounted on a wiring board (an interposer) through an elastomer, and an insulator with which the periphery of the semiconductor chip has been sealed.

(3) A technique, which can reduce a deterioration in electrical characteristics, can be provided in a semiconductor device comprising a semiconductor chip, which has been mounted on a wiring board (an interposer) through an elastomer, and an insulator with which the periphery of the semiconductor chip has been sealed.

The invention has been described in detail with particular reference to preferred embodiments, but it will be understood that variations and modifications can be effected within the scope of the invention as set forth in the appended claims.

What is claimed is:

1. A semiconductor device comprising:

a wiring board comprising a conductor wiring having a predetermined pattern provided on a surface of an insulating substrate;

an elastomer layer provided on the wiring board;

a semiconductor chip bonded onto the wiring board through the elastomer; and an insulator for sealing the periphery of the semiconductor chip and the elastomer layer, the semiconductor chip in its external terminal being electrically connected to the conductor wiring, wherein the elastomer layer comprises a moisture vent portion at a part of an outer end of the elastomer layer, the moisture vent portion being not sealed by the insulator and exposed to an outside of the semiconductor device, and a sealed portion at an other part of the outer end, the sealed portion being sealed by the insulator and not exposed to the outside of the semiconductor device.

2. The semiconductor device as claimed in claim 1, wherein the elastomer layer comprises a plurality of the moisture vent portions in the form of projections.

3. The semiconductor device as claimed in claim 2, wherein at least one of the projections has an approximately rectangular shape.

* * * * *